United States Patent [19]

Horstmann et al.

[11] Patent Number: 5,014,226

[45] Date of Patent: May 7, 1991

[54] METHOD AND APPARATUS FOR PREDICTING THE METASTABLE BEHAVIOR OF LOGIC CIRCUITS

[75] Inventors: Jens U. Horstmann, Sunnyvale; Robert L. Coates, San Jose, both of Calif.; Hans W. Eichel, Braunschweig, Fed. Rep. of Germany

[73] Assignee: LSI Logic Corporation, Milpitas, Calif.

[21] Appl. No.: 251,619

[22] Filed: Sep. 29, 1988

[51] Int. Cl.⁵ .................. G06F 11/00; G01D 21/00
[52] U.S. Cl. .................. 364/551.01; 364/489; 371/22.1; 371/22.6; 307/440
[58] Field of Search .......... 364/550, 551.01, 488–490; 371/22.1, 22.5, 22.6, 23; 307/440, 443

[56] References Cited

U.S. PATENT DOCUMENTS 4,546,472  10/1985  Volk et al. .................. 371/22.1
4,583,179   4/1986  Horll et al. ................. 371/22.6
4,797,838   1/1989  Nelson et al. ............. 364/551.01

Primary Examiner—Parshotam S. Lall
Assistant Examiner—Brian M. Mattson
Attorney, Agent, or Firm—Skjerven, Morrill, MacPherson, Franklin & Friel

[57] ABSTRACT

A circuit for detecting erroneous logic outputs due to metastable behavior in multistable devices (i.e. flip flops) includes a digitally programmable delay unit integrally formed on a common substrate with the multistable devices. Strong correlations between the operating characteristics of the programmable delay unit and the multistable devices may be established during tests for different temperatures, power supply settings and fabrication process variations. Such integration and the digital nature of the programmable delay unit enables repeatable test results and strengthens confidence in predictions that are derived from tests conducted to determine the mean time between failure that is to be expected from the multistable devices. In one embodiment, metastable devices of different design are integrally formed on the common substrate so that comparisons can be made among the metastable behaviors of the different designs. In a second embodiment, metastable devices of the same design but supplied with different actuating signals are formed on the common substrate for comparison of their respective metastable behaviors.

15 Claims, 15 Drawing Sheets

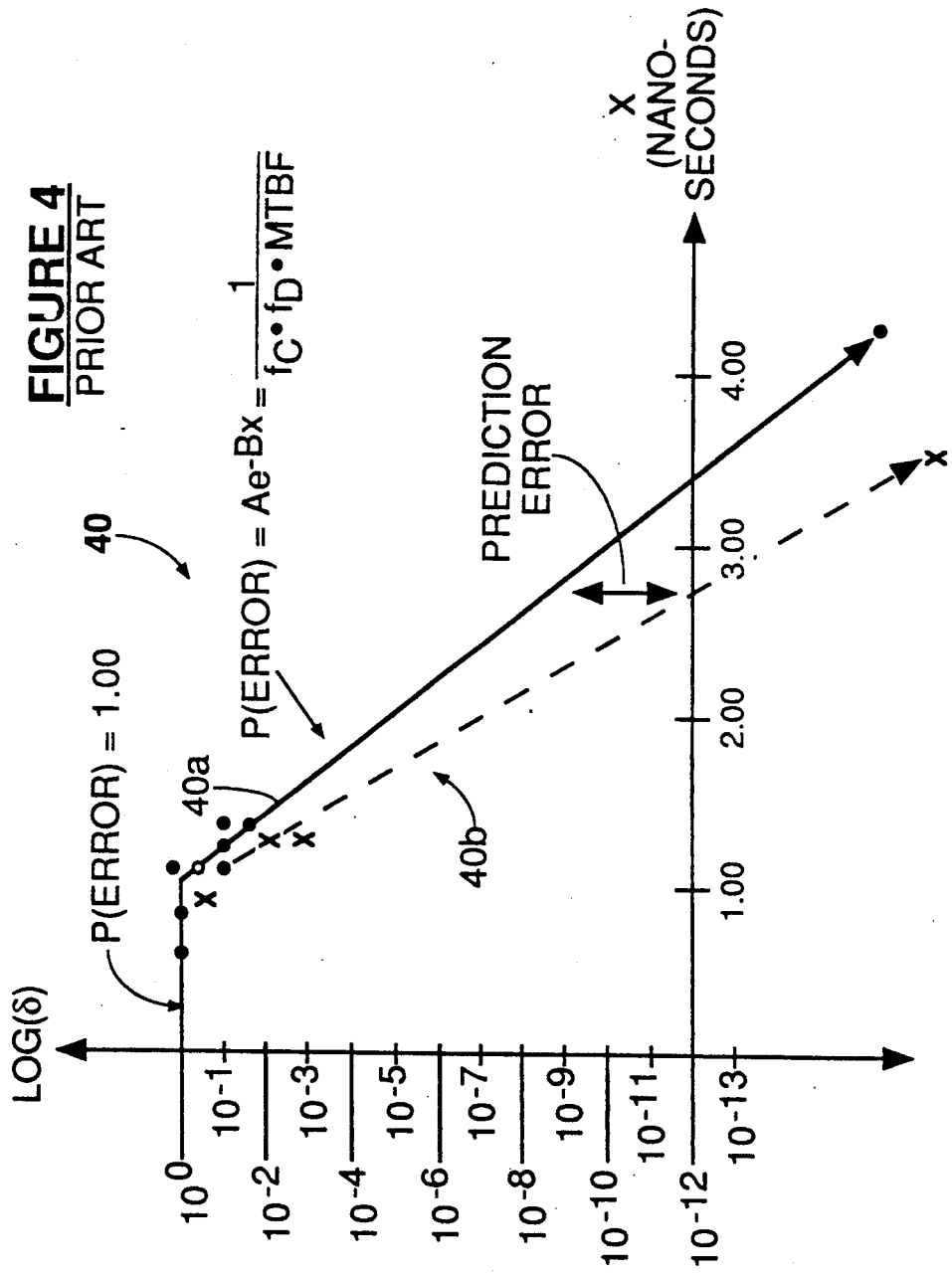

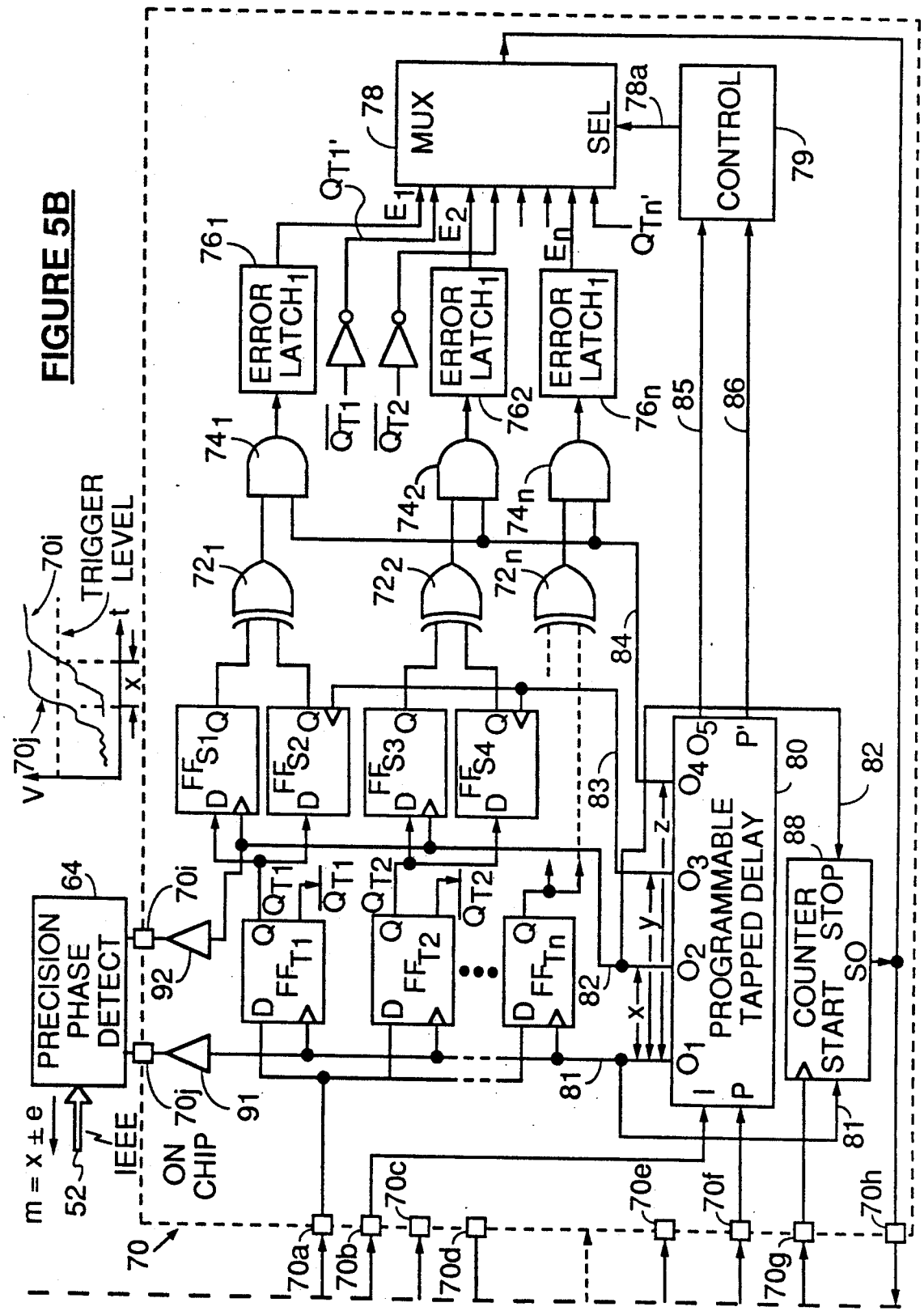

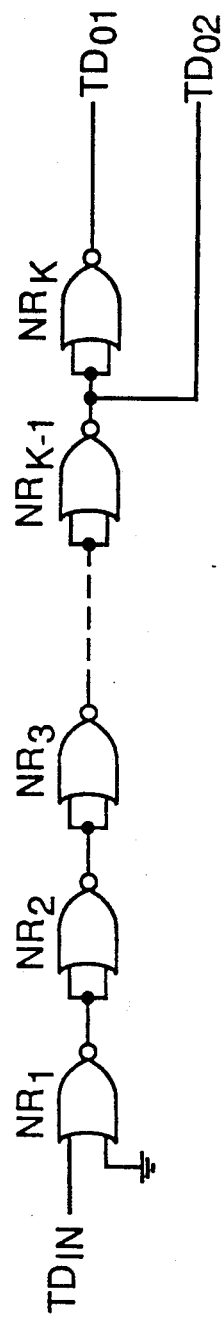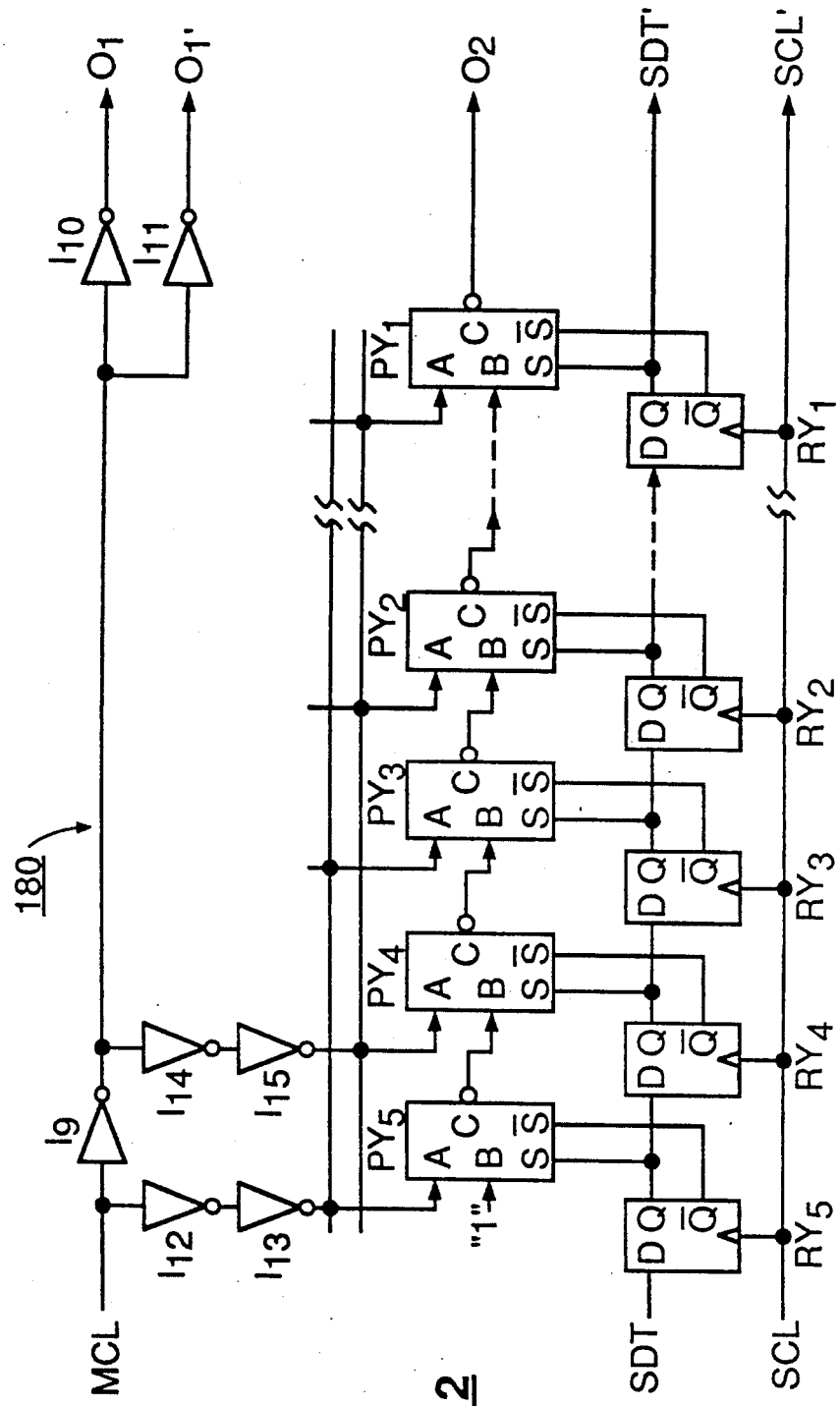
FIGURE 11
FIGURE 12

METHOD AND APPARATUS FOR PREDICTING THE METASTABLE BEHAVIOR OF LOGIC CIRCUITS

BACKGROUND OF THE INVENTION

1. Field of the Invention

This invention is generally directed to the analysis of the mean time between failure (MTBF) of digital circuits and more specifically to the problem of predicting MTBF due to metastable behavior in multistable devices such as flip flops.

2. Description of the Relevant Art

A large number of digital circuits can be characterized as having two or more stable states at which the systems preferentially remain and one or more unstable states from which the systems tend to shy away. Stable states may be visualized as low points in an energy plane populated by valleys, plateaus and hills. Unstable states may be seen as hills from which the systems can dynamically roll off to eventually settle in a valley below. There is a certain type of rolling behavior known as metastable behavior which can lead to failure of digital devices. Because this type of behavior is presently understood by only a few in the art, the following detailed explanation is included here. Those who are well versed in metastability theory can skip forward to the last paragraph before the summary of the invention. Reference to papers published for session 16 of the Wescon/87 ® Convention held November 17-19, 1987 in San Francisco, California might be helpful. The session record is entitled "Everything You Might Be Afraid To Know About Metastability" and includes discussions by Kim Rubin of Force Computers Inc., Keith Nootbaar, et al. of Applied Micro Circuits Inc., John Birkner of Monolithic Memories and Martin Bolton of Bristol University.

A multistable digital system can be perceived as one that moves from one valley to another as it is switched from one stable state to the next. Energy must be supplied to the system to push the system across the energy plane and help the system overcome barriers posed by high points between valleys. If an insufficient amount of force or energy is supplied for overcoming high points, the outcome of an actuation operation might become indeterminate. The induced actuating force of an input signal may be on the border line of that required for propelling a system out of one valley, over a barrier and into a desired second valley. It may not be known for sure whether the system has actually switched from one stable state to the next as intended or whether the system has rolled to an undesirable state.

The phenomenon is referred to by various names including "the metastability problem", "arbitration conflict" and "synchronization failure." Regardless of the term used, it is known that when such a phenomenon occurs it can cause a logic circuit to produce erroneous outputs and that such erroneous outputs may lead to catastrophic results. Given this possibility, it is desirable to have a quantitative method for studying the phenomenon so that the benefits of a digital system can be intelligently weighed against the risk of an erroneous output.

By way of example, there are situations where a digital computer is designed for placement in remote locations, such as on board a space satellite, and the computer is required to operate over a period of at least ten years without a single error. If a pre-flight evaluation of the computer design were to show, statistically speaking, that there is a mean time between failure (MTBF) of say two years under worst case conditions, then it will be obvious that additional measures need to be taken to extend the MTBF of the computer. Testing the computer in real time over multiple ten year periods in order to detect how many errors can be caused by metastable events is not practical. A method for rapid statistical evaluation of logic circuit components needs to be devised so that MTBF can be predicted on an accelerated basis. The evaluation method should be both accurate and capable of easy repetition (for confirmation purposes) so that risk assessments can be made with valid MTBF values rather than purely speculative data.

Numerous models have been proposed for studying the so-called "metastable" behavior of multistable logic circuits. FIG. 1A shows one circuit model 10 proposed for studying a bistable switch SW that is capable of switching between a logic low state (L) and a logic high state (H). Switching occurs when an input signal $S_{in}$ of sufficient energy is supplied at an input of the switch SW. A first amplifier $A_1$ of a first predetermined gain and bandwidth amplifies the input signal $S_{in}$ by a predetermined factor and supplies actuation energy $E_{act}$ to a switchable part (e.g. armature) of the switch SW. A second amplifier $A_2$ of a second predetermined gain and bandwidth is provided, coupled to an output node $N_o$ of the switch, for supplying a holding energy $E_{hold}$ in a feedback manner to the switchable part so as to maintain the switch SW in a present state. The holding energy $E_{hold}$ opposes accidental actuation due to noise and also opposes the initial force of any actuation energy $E_{act}$ supplied by the first amplifier $A_1$. An inherent resistance R and capacitance C of the model 10 cause an output signal $S_{out}$ at the output node $N_o$ to behave as a continuous exponential function of the form $S_{out} = f(e^{-t/RC})$.

Referring to FIG. 1B, it can be seen that the continuum of values attainable by the output signal $S_{out}$ may be partitioned to define a low state (L state), a meta state (M state) and a high state (H state), arranged in the recited order. A system energy curve 12 having two minimum points, 14 and 16, respectively corresponding to the L and H states of the model and a peak, 15, corresponding to the M state, may be drawn to explain the model's behavior in a loose manner. The current state of the model 10 may be thought of as represented by the position of a rollable ball 18 which moves along the curve and eventually comes to rest at a minimum point in one of two energy valleys (stable states) after it is pushed over an energy crest (barrier) defined by the peak 15. The shape of the energy barrier corresponds to forces generated by the holding energy $E_{hold}$ of the second amplifier $A_2$. The holding energy $E_{hold}$ initially opposes the actuation energy $E_{act}$ but may later switch to aid the actuation energy once the barrier is overcome and the ball 18 begins to roll downhill. The speed at which the ball rolls is determined by the gain bandwidth products of the system amplifiers, $A_1$ and $A_2$. Because the gain bandwidth products of real world amplifiers (as opposed to hypothetical models) tend to be functions of environmental factors such as temperature, power supply settings, fabrication process variations and so forth, it is helpful to view the energy curve 12 as one that changes its shape when the environmental factors shift. If these factors shift to produce relatively high gain bandwidth products, the steepness of the downhill slope increases, the ball rolls away faster and is thus, statistically speaking, less likely to be found in the vicinity of the peak 15. On the other hand, if the gain bandwidths products become relatively small as a result of environmental changes, the slopes become less steep and the probability that the ball will be found in the vicinity of the peak increases. It will be seen later in the discussion of the invention that environmental factors such as temperature and power supply settings can significantly alter the likelihood of what we will call "metastable behavior." For the present, it is sufficient to understand that environmental factors determine how likely it is that the ball will be found in the vicinity of the peak 15.

If the ball 18 is pushed with just barely enough energy $E_{act}$, it is possible that the ball will come to rest precisely at the maximum point of the curve peak 15 where the slope of the curve (dE/dS) is equal to zero. When so positioned, the ball 18 may remain in the M state for an indefinite period of time, or it may randomly roll towards one or the other of the L and H states as a result of random environmental noise. In such a case the final resting state of the model 10 becomes uncertain and the outcome needs to be defined in a statistical manner. This type of indeterminate behavior is referred to as metastable behavior.

Multistable circuits often include one or more positive feedback loops which modify the above picture such that it may be necessary to further consider the curve 12 as being elastically deformable and to view its peak 15 as being able to temporarily change shape or shift in position relative to the L and H states during actuation to create what may appear in effect to be a third valley 15a (as indicated by the dashed portion of FIG. 1B) in the metastable region M. The valley 15a, which is better shown in FIG. 1D as being distributed over time, provides an area in which the ball 18 may oscillate back and forth for an indefinite period of time before moving on to finally rest in one of the stable states, L and H. This oscillatory behavior may be attributed in the particular model 10 of FIG. 1A to positive feedback in the feedback loop formed by the second amplifier $A_2$ and the RC network. The occurrence of such oscillatory behavior may be rare in the short run (especially when the supplied actuation energy $E_{act}$ is thought to be relatively large) but there is a real possibility that oscillation will occur (even with large actuation energies) and this possibility can't be ignored when analyzing the long run.

FIG. 1C shows a so called first order model that is often used to study metastability. The model comprises two ideal NAND gates (hypothetical circuits of infinite gain bandwidth product) each having an input coupled to an output of the other through an RC network. When the delay time of each of the RC networks is increased, the input signal at the input of each NAND gate spends more time in the vicinity of the gate threshold level (gate switching point) and the probability of metastable behavior increases (i.e. there is a greater likelihood that random noise might position the system at the zero slope midpoint of its energy curve). This behavior of the model correlates well with various types of metastable behavior observed in real world circuits and hence lends support to the validity of the first order model.

The metastability phenomenon discussed thus far is perhaps better understood by reference to a concrete example. The number of variables that may affect metastable behavior will be appreciated by considering the circuit of FIG. 2. FIG. 2 illustrates the circuit topology of a well known bistable device 20 often referred to as an R-S flip flop. The device 20 is formed by cross coupling a pair of dual input NAND gates, 22 and 24. While the circuit topology of this device 20 is very well known in the art, experience with the metastable behavior of its various embodiments is limited and thus not fully understood. This is particularly true of flip flop circuits fabricated with the newer high density VLSI technologies wherein new materials, narrower line widths, and so forth are utilized in place of older designs.

In the design of the bistable device 20, a first, inverted input 22a of NAND gate 22 is connected to receive a first input signal $V_{in1}$. A first, inverted input 24a of NAND gate 24 is connected to receive a second input signal $V_{in2}$. Second inputs, 22b and 24b, of NAND gates 22 and 24 are respectively coupled to outputs 24c and 22c of the NAND gates to thereby form multiple feedback loops. A number of oscillatory modes become possible because of this type of cross-coupled feedback topology.

Output 22c (node $N_o$) will remain at a steady state low (L) if a high level (H) is present for a long time at the first input 24a (reset terminal) of NAND gate 24 and a low level (L) is simultaneously present for a long time at the first inverted input 22a (set terminal) of NAND gate 22. If a logic high (H) set pulse 26 of a short effective duration $T_{act}$ is included in the first input signal $V_{in1}$, as shown in FIG. 2, the set pulse 26 will supply a finite amount of actuation energy $E_{act}$ to the bistable device 20. This energy is supposed to initiate the switching of output 22c from its logic low state (L) toward the logic high state (H). But the amount of actuation energy $E_{act}$ that is effectively presented by the set pulse 26 will depend on the height of the set pulse 26 above a threshold level $V_{T1}$, that threshold level being one associated with the input of NAND gate 22 (i.e. such as the gate turn on threshold of MOSFET devices) and on the duration of the effective time period $T_{act}$ during which the set pulse 26 exceeds the threshold level $V_{T1}$.

In most instances, say 98% for the sake of example here, the output 22c of NAND gate 22 will move from its initial low state (L) through the metastate (M) and come to rest in the high state (H) when the set pulse 26 is presented. (This 98% figure is, as practioners of digital electronics will of course appreciate, a gross exaggeration. It is used here so simple numbers can be worked with. The probability of the L→M→H transition is usually 99.99% or better in commercial grade products.) There is a finite possibility however, say 1.5% for this example, that the output 22c will move from the L state to the M state and then return back to the L state prior to a preselected strobe time $t_s$ because an insufficient amount of actuation energy was supplied for assuredly switching the state of the output node $N_o$. This event could happen, for example, when there is a large amount of noise present at the output node $N_o$ and the noise is fed back to the circuit inputs by way of one of the dual feedback paths or if node $N_o$ is heavily loaded. The L→M→L outcome may at times be considered a failure of the bistable device 20 if it is known that a valid logic high (H) was presented at the set input 22a, a valid low (L) was simultaneously present at the reset input 24a and that output node $N_o$ was therefore supposed to switch from the L state to the H state. If a train of set pulses 26 having very short effective durations (e.g. a $T_{act}$ of a few nanoseconds or less) and reset pulses 27 are repeatedly supplied to the R-S flip flop 20 at a rate of say one every 10 microseconds (a 100 KHz data rate), it can be predicted that the device 20 will produce an incorrect result on the average of approximately once every 667 microseconds in our example. If the probability of the L→M→L sequence were to somehow drop from 1.5% to say 0.5%, the MTBF will increase threefold to 2000 microseconds. If the data rate were to be reduced to one pulse every 100 microseconds (a data frequency of 10 KHz) instead of one every 10 microseconds then the MTBF will increase by tenfold to approximately one error every 6,667 microseconds. It can be seen from this that the MTBF is proportional to the inverse of the data rate and the inverse of the failure mechanism probability.

The above is but one of many environments in which the device 20 may be operating. In some cases, the bistable device 20 (R-S flip flop) is required to supply a valid output level within a predetermined, fixed time interval, $t_0$ to $t_s$, i.e. before a reset pulse 27 and/or a new system clock pulse arrives. Its output state after the interval is ignored. There is a finite probability, say 0.5% for the sake of our example, that the output 22c will still be in the M state (e.g. still oscillating) when the predetermined time interval terminates. In such a case, there is a probability that the M state output will be incorrectly interpreted by subsequent circuitry as a logic low L when the result was supposed to be a logic high H or that the M state at the output 22c will trigger further undesirable oscillations when presented to the digital input(s) of the subsequent circuitry (not shown). Such an occurrence constitutes a failure of the bistable device 20 which must be accounted for when studying the reliability of a digital decision making system.

Even when the peak magnitude of set pulse 26 is sufficiently large relative to the input threshold level $V_{T1}$ to assuredly switch device 20 under normal timing constraints, the effectiveness of that peak magnitude may be cut short by the counter-action of a second signal at a second input terminal. If the first input 24a (reset terminal) of NAND gate 24 receives a reset pulse 27 at some time $t_{G2}$ well after the application of set pulse 26, this will usually not affect the outcome of the above-described switching operation. On the other hand, if the second input signal $V_{in2}$ includes a reset pulse 27 whose leading edge (a low to high transition) occurs during the same time when the set pulse 26 is still being is presented, the leading edge of the reset pulse 27 may cut down the effective actuation time $T_{act}$ of the applied set pulse 26. This can increase the probability that set pulse 26 will fail to switch output 22c from the L state to the H state. The probability of failure will approach 100% as the effective introduction time $t_{G2}$ of the reset pulse 27 in the second input signal $V_{in2}$ (when $V_{in2}$ exceeds a second threshold level $V_{T2}$) is pushed backwards in time towards the gating time $t_{G1}$ at which the first input signal $V_{in1}$ first begins to overcome the first threshold level $V_{T1}$. This last scenario, in which the reset pulse 27 shifts in time to overlap at least a portion of the set pulse 26 ($t_{G2}$ approximately equal to $t_{G1}$), can occur with regularity in asynchronous types of logic circuits. It raises the probability of generating a metastable event, and therefrom an erroneous output.

A test environment needs to be devised to take into account the above and possibly other failure mechanisms. The effective duration $T_{act}$ of set pulse 26 (phase difference between rising edge of set pulse 26 and rising edge of reset pulse 27) might shrink to a point where it has to be measured in terms of picoseconds ($10^{-12}$ seconds) or even smaller units (e.g. femtoseconds ($10^{-15}$ seconds)). If a digital logic circuit is appropriately designed to avoid signal race problems, the likelihood that a reset pulse 27 (or a flip flop clocking signal) will coincide with a set pulse 26 (flip flop data signal) is relatively small when considered over the short run (e.g. one hour of operation). But given all the unpredictable effects of circuit environment on signal propagation delays, the close coincidence of flip flop set and reset pulses or flip flop clock and data edges is an event which will probably occur sometime during the lifetime (e.g. ten years) of an arbitrary set of digital logic circuits. An accurate method is needed for quickly determining the probability of failure from this and/or others of the above described arbitration conditions.

A test circuit 30, as illustrated in FIG. 3, has been proposed for studying the behavior of flip flops. A test flip flop $FF_t$ having a decision output $Q_F$ is formed on an integrated circuit chip 32 together with a first sampling flip flop $FF_{s1}$, a second sampling flip flop $FF_{s2}$, and an exclusive OR gate 34. Connection pads 32a and 32b are provided on the IC chip 32 for supplying a DATA signal of a first frequency $f_D$ (e.g. 1.5 MHz) to one input of the test flip flop $FF_t$ and supplying a CLOCK signal of a second frequency $f_C$ (e.g. 2 MHz) to a second input of the test flip flop $FF_t$. Additional connection pads, 32c and 32e are provided on the IC chip 32 for supplying first and second strobe signals, $STROBE_1$ and $STROBE_2$ to the clock inputs of sampling flip flops $FF_{s1}$ and $FF_{s2}$. The output of exclusive OR gate 34 is supplied through yet another connection pad 32d to an external error counting device 36. Power supply connections and miscellaneous control lines are not shown.

An error condition or "event" is defined to occur when there is a difference in level between the Q outputs of sampling flip flops $FF_{s1}$ and $FF_{s2}$ at some time period, $t_0+y$, following the time $t_0$ of a triggering edge of the CLOCK signal. Two variable delay circuits, 38 and 40, are provided to respectively supply the $STROBE_1$ and $STROBE_2$ signals to connection pads 32c and 32e of the IC chip. The delay circuits, 38 and 40, are precision types located off of the chip 32 and designed to be adjusted manually to set the arrival times of their respective strobe signals to first and second strobe times, $t_0+x$ and $t_0+y$. The frequency $f_D$ of the DATA signal is set to a value (e.g. 1.5 MHz) that is not a harmonic of the frequency $f_C$ (e.g. 2 MHz) of the CLOCK signal so that coincidence between edges of the DATA and CLOCK signals will occur randomly. Sampling flip flops $FF_{s1}$ and $FF_{s2}$ are supposed to capture and hold the states of output $Q_F$ of the test flip flop $FF_t$ at different points in time, $t=t_0+x$ and $t=t_0+y$, in response to the $STROBE_1$ and $STROBE_2$ signals.

FIG. 3B illustrates some possible waveforms or "paths" that may be taken by the decision output $Q_F$ of a test flip flop $FF_t$ over time. $Q_F$ is assumed to be at logic low (L) prior to the arrival of a triggering edge of the CLOCK signal at time $t_0$. No change occurs in $Q_F$ during a propagation delay period $T_{PD}$ of the test flip flop $FF_t$. At a second time $t_1$ the output $Q_F$ begins to move out of the L state and into the metastate (M state). A finite gain associated with the test flip flop $FF_t$ inhibits the output $Q_F$ from fully slewing to either a H or L level until a third time, $t_2$. Due to the metastability phenomenon described above, the output $Q_F$ may stochastically select one of many different paths, including oscillatory ones of indefinite length, to finally arrive at either the H level or the L level. For practical intents, the outcome state of output $Q_F$ is assumed to be 100% resolved by some predetermined fourth time $t_3$ (say $t = t_0 + 100$ nanoseconds) following time $t_2$ even though theoretically the final state of $Q_F$ is never resolved 100%. But at some arbitrary strobe time $t_s$ prior to $t_3$, the output $Q_F$ might be still meandering or oscillating about a nondigital level $M_0$ which is neither a valid logic high (H) nor a valid logic low (L).

It should be understood that for modern devices, the periods between times $t_0$ through $t_3$ will usually be measured in very small units such as 60 nanoseconds or less. It should also be understood that modern circuits usually require a valid output level, H or L but not $M_0$ in a much shorter period, $t_o$ to $t_s$. The period $t_o$ to $t_s$ is often measured in tens of nanoseconds or less (e.g. from 25 ns down to 1.5 ns or less).

The delay value y corresponding to variable delay circuit 40 can be easily adjusted to exceed time $t_3$ using standard delay methods. The crucial problem with the circuit 30 is that the delay value x, corresponding to variable delay circuit 38, needs to be finely adjusted to different values between times $t_0$ and $t_3$ to a resolution of say, one nanosecond or less. This is not easy. A multitude of factors including subtle temperature changes, power supply changes, the level of background radiation (e.g. cosmic rays), etc. can shift the actual delay of circuit 38 by a few nanoseconds. The resolution of circuit 38 is therefore rarely better than one or two nanoseconds and this creates problems A shift of just one or two nanoseconds can alter test results substantially.

In use, the test circuit 30 is allowed run for a predetermined length of time (e.g. five minutes) at a particular setting of the delay circuit 38 (e.g. 5 nanoseconds ± a resolution error) and the number of errors accumulated in counter 36 for each assumed setting of the x value is then recorded.

Referring to FIG. 4, a logarithmic plot of the number of errors detected by counter 36 during a predetermined test period is prepared for every assumed value of x corresponding to a particular setting of the variable delay circuit 38. It can be shown mathematically (assuming the first order model of FIG. 1C) that this logarithmic plot 40 should include a linear portion 40a satisfying the formula:

$$P(error) = A\, e^{-Bx} = 1/(f_C f_D MTBF)$$

or written in logarithmic form:

$$\log[P(error)] = \log[A] - Bx = \log[1/(f_C f_D MTBF)]$$

where P(error) is the probability of an event (erroneous outcome) during the test period and MTBF is the average or mean time between failure associated with the flip flop $FF_t$ for given data rate $f_D$ and clock rate $f_C$. Parameters A and B are constants defining the linear portion 40a of the P(error) curve.

By varying the value of x, it can be experimentally shown that the number of failures detected by the test circuit 30 of FIG. 3A will approach 100% while x is smaller than the propagation delay time $T_{PD}$ of the test flip flop $FF_t$ (FIG. 3B). The number of errors detected by counter 36 will begin to converge on lower values of error probability once x is increased beyond the second time $t_1$ of the graph shown in FIG. 3B. When x is increased to surpass the fourth time $t_3$ of FIG. 3B and the test time is limited to some finite length (e.g. five minutes), the number of errors found in counter 36 will flatten out. As such, the test circuit 30 of FIG. 3A should theoretically be capable of producing values of P(error) corresponding to plot points of assumed x values in the narrow time window between $t_0$ and $t_3$ (e.g. 0 to 100 nanoseconds). No plotting points will be produced for assumed values of x outside the window of $t_3 - t_0$, but since the segment 40a is assumed to be linear (for the first order model), the graph can be extended by means of linear extrapolation to predict the probability of error for larger values of x (e.g. on the order of 1 microsecond or greater) exceeding $t_3 - t_0$. The observed values of constants A and B can then be inserted into the formula:

$$MTBF = 1/[f_C f_D A\, e^{-Bx}]$$

to solve for MTBF given x values much greater than $t_3$.

It was hoped that the circuit 30 of FIG. 3A could be used for accurately calculating the mean time between failure (MTBF) in a repeatable manner for different clock frequencies $f_C$ and different data frequencies $f_D$. Laboratory experiments failed to uphold this expectation. When measurements were taken, a different plot, i.e. 40b, having different A and B parameters was produced with each test run. The different plots appeared to be shifted in time (x scale) by amounts on the order of perhaps a few nanoseconds. These minor shifts in time were believed due to the resolution limit of the variable delay circuit 38. But no way for improving the resolution of delay circuit 38 was apparent. Even minute shifts on the order of a fraction of a nanosecond can shift values along the MTBF scale by as much as an order of magnitude or more. Results obtained with test circuit 30 were not repeatable, and as such, a question arose with respect to how accurately the results can predict the MTBF of critical logic devices and what confidence can be placed on such predictions. A more accurate method for predicting the MTBF of digital decision making circuits is needed.

A test circuit comprising an analog type of voltage controlled variable delay circuit has been proposed by F. Rosenberger and T. J. Chaney in their paper "Flip-Flop Resolving Time Test Circuit", IEEE J. Solid State Circuits, Vol. SC-17, No. 4, August 1982. The analog-based test circuit failed to produce consistent results over multiple test runs and thus little confidence could be placed in MTBF predictions made with such a circuit. A different approach had to be found.

SUMMARY OF THE INVENTION

It is an object of the invention to obviate shortcomings of the above described test systems and provide an improved method and apparatus for studying the metastable behavior of logic circuits.

In accordance with the invention, a metastable behavior detecting system is fabricated to comprise a digitally programmable time delay circuit integrally formed on the same semiconductive substrate (i.e. a monocrystalline block of silicon) as a digital decision making circuit to be tested (arbitration circuit under test). Substantially identical conduction paths from first and second terminals of the delay circuit are routed to terminal points of the substrate. A phase detector capable of precisely measuring the delay of the delay circuit is coupled to the substrate terminal points. First and second sampling means for sampling a decision output of the decision making circuit at different points in time, as established by the digitally programmable time delay circuit, are also integrally formed on the substrate.

Such integration allows the lengths of conductors coupling the decision making circuit (arbitration circuit) to the programmable time delay circuit and the first and second sampling means to be minimized and this improves the timing resolution of the metastable behavior detecting system. Because the arbitration and delay circuits share a common substrate, tight correlations may be obtained between a specific operating temperature and behaviors of both the digitally programmable time delay circuit and the arbitration circuit under test. Correlations between factors such as power supply settings, temperature, and a particular fabrication process can be tightly coupled to the behavior of the two circuits in a convenient manner. The digital nature of the programmable delay circuit eliminates uncertainties associated with delay circuits whose delay times are controlled by analog means. A procedure controlling computer is preferably used to simultaneously control the substrate temperature, the timing of the digitally programmable delay circuit and the level of power supplied to the substrate.

In accordance with one aspect of the invention, multiple arbitration circuits of different designs are formed on the same integrated circuit so that comparisons between arbitrator designs can be made relative to a common temperature, a common fabrication process, a common power supply setting and/or other behavior influencing factors.

In accordance with a second aspect of the invention, multiple arbitration circuits of the same design are formed on the same integrated circuit but the input and output loadings of these same design arbitration circuits are varied for comparing the effects of each variation.

Other aspects of the invention will become apparent from the detailed description given below.

BRIEF DESCRIPTION OF THE DRAWINGS

FIG. 4 is a logarithmic plot of error probability versus sampling time.

FIG. 11 shows a non-programmable delay unit.

FIG. 12 shows a programmable delay unit.

DETAILED DESCRIPTION OF THE PREFERRED EMBODIMENTS

The repeatability of measured results was found to be remarkably improved by placing a digitally controlled, programmable time delay circuit on the same substrate with one or more arbitration circuits under test. It is postulated that the digital nature of the programmable time delay circuit and the close positioning of the programmable delay circuit on the same substrate with the arbitration circuits creates a strong correlation between operating characteristics of the arbitration circuits, operating characteristics of the programmable delay circuit and influencing factors such as temperature, power supply setting, fabrication process, and so forth. It is further postulated that the shortening of conduction paths between the arbitration circuits under test and the programmable time delay circuit improves the precision and repeatability of the measurement method.

The invention will now be described in further detail, in terms of its best presently contemplated modes. It is to be understood that the detailed description is intended to be merely illustrative of the invention and is not to be taken in a limiting sense.

Figure 1A:
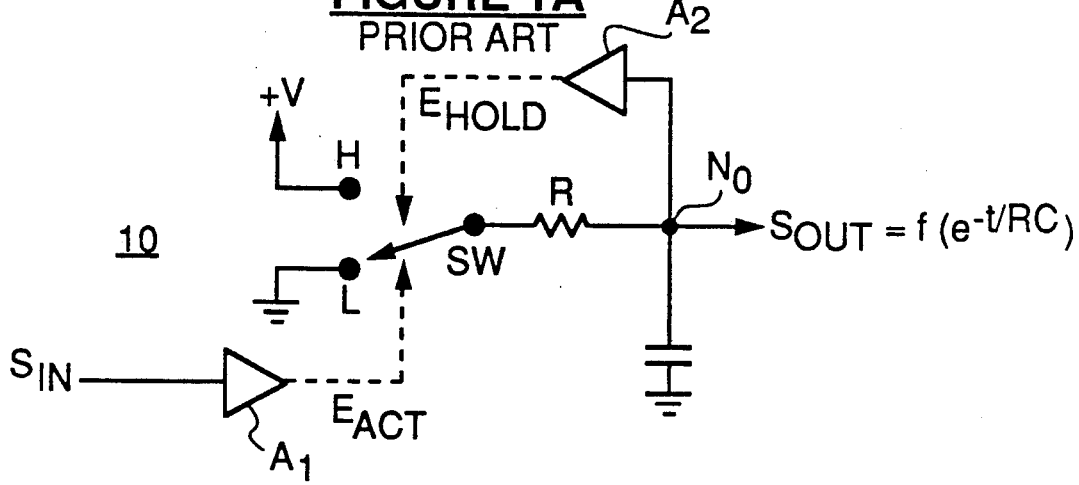
FIG. 1A shows a proposed model for a bistable device.
Figure 1B:
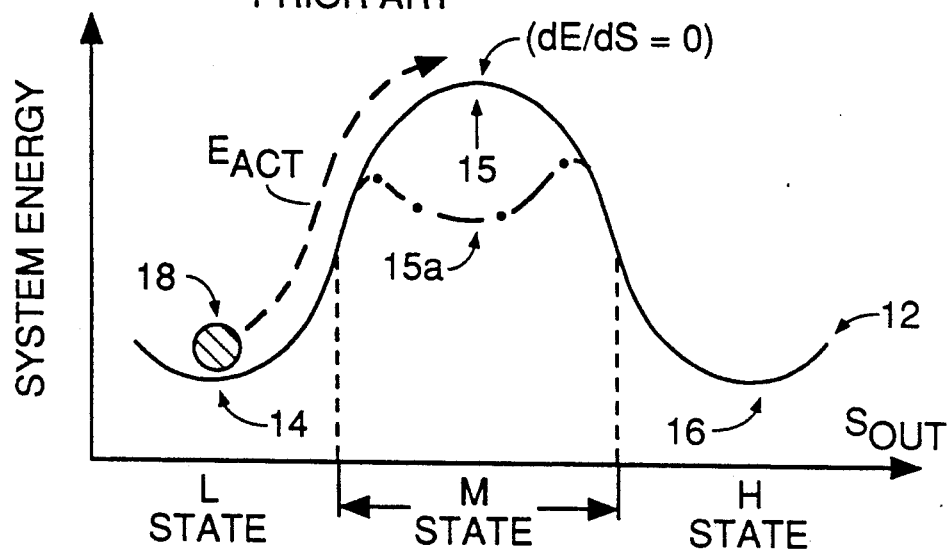
FIG. 1B is an energy curve showing possible energy states of a multistable system.
Figure 1C:
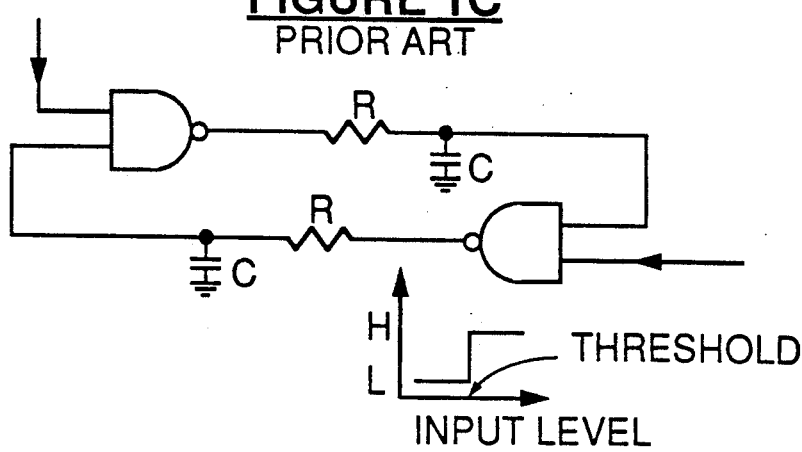
FIG. 1C shows a first order model used for studying metastability.
Figure 1D:
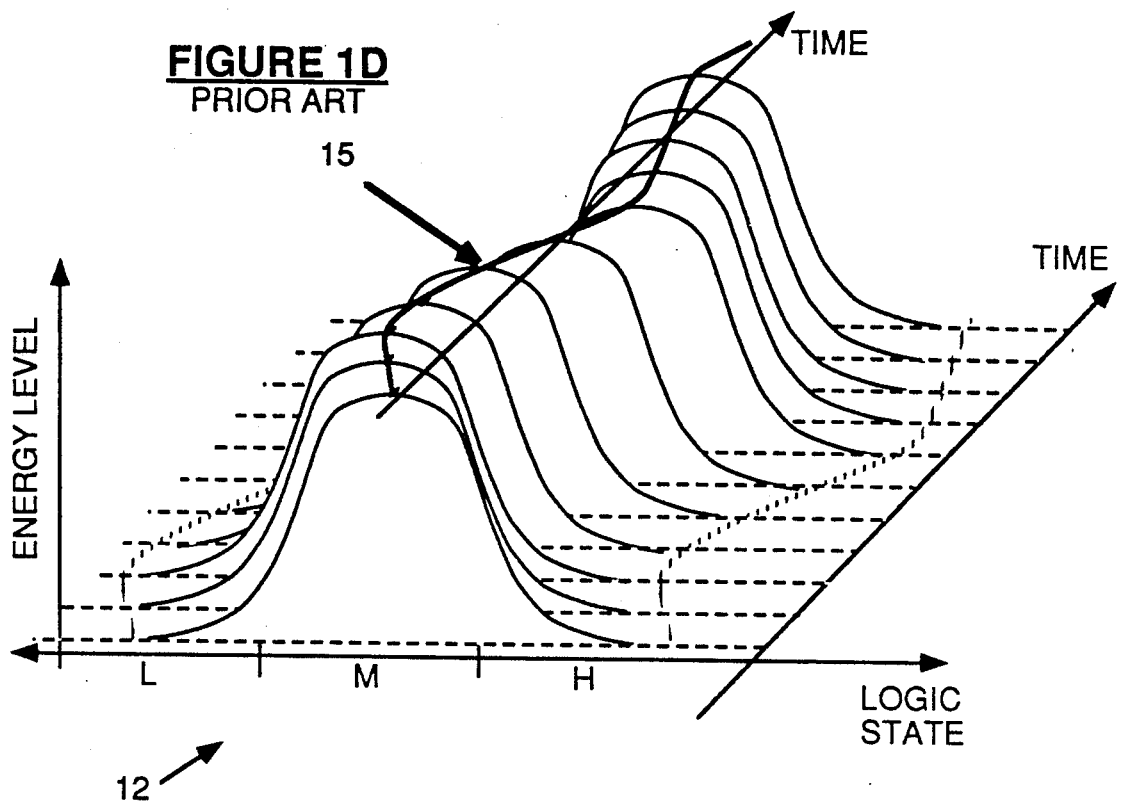
FIG. 1D shows a three dimensional system energy curve plotted over time versus logic state and energy level.
Figure 2:
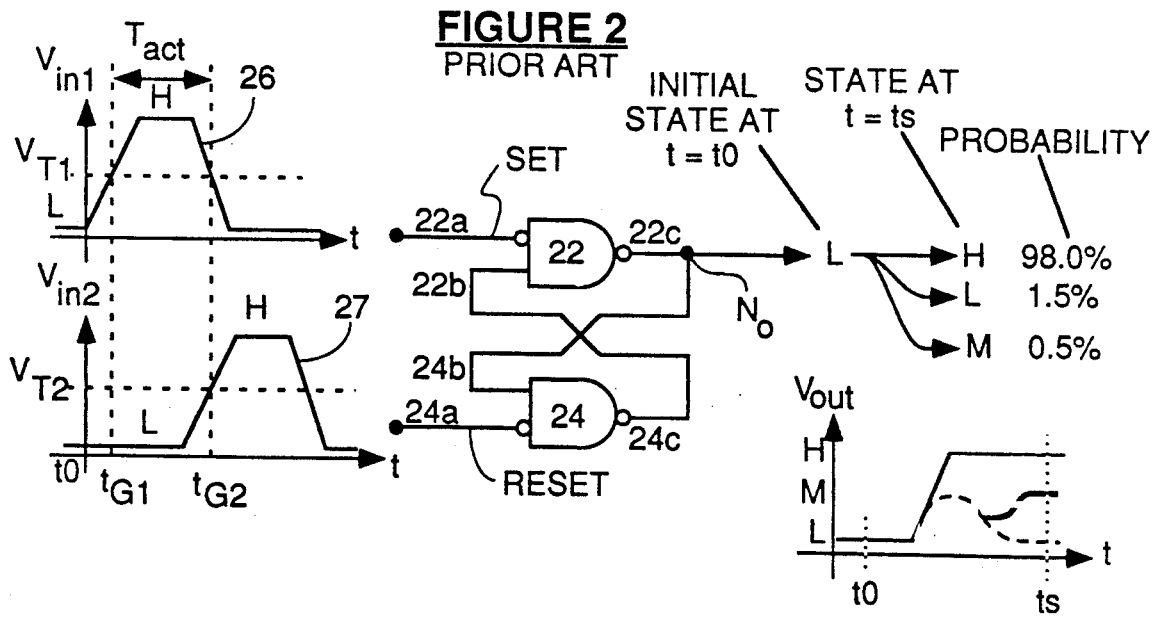
FIG. 2 is a schematic diagram of a known bistable circuit.
Figure 3A:
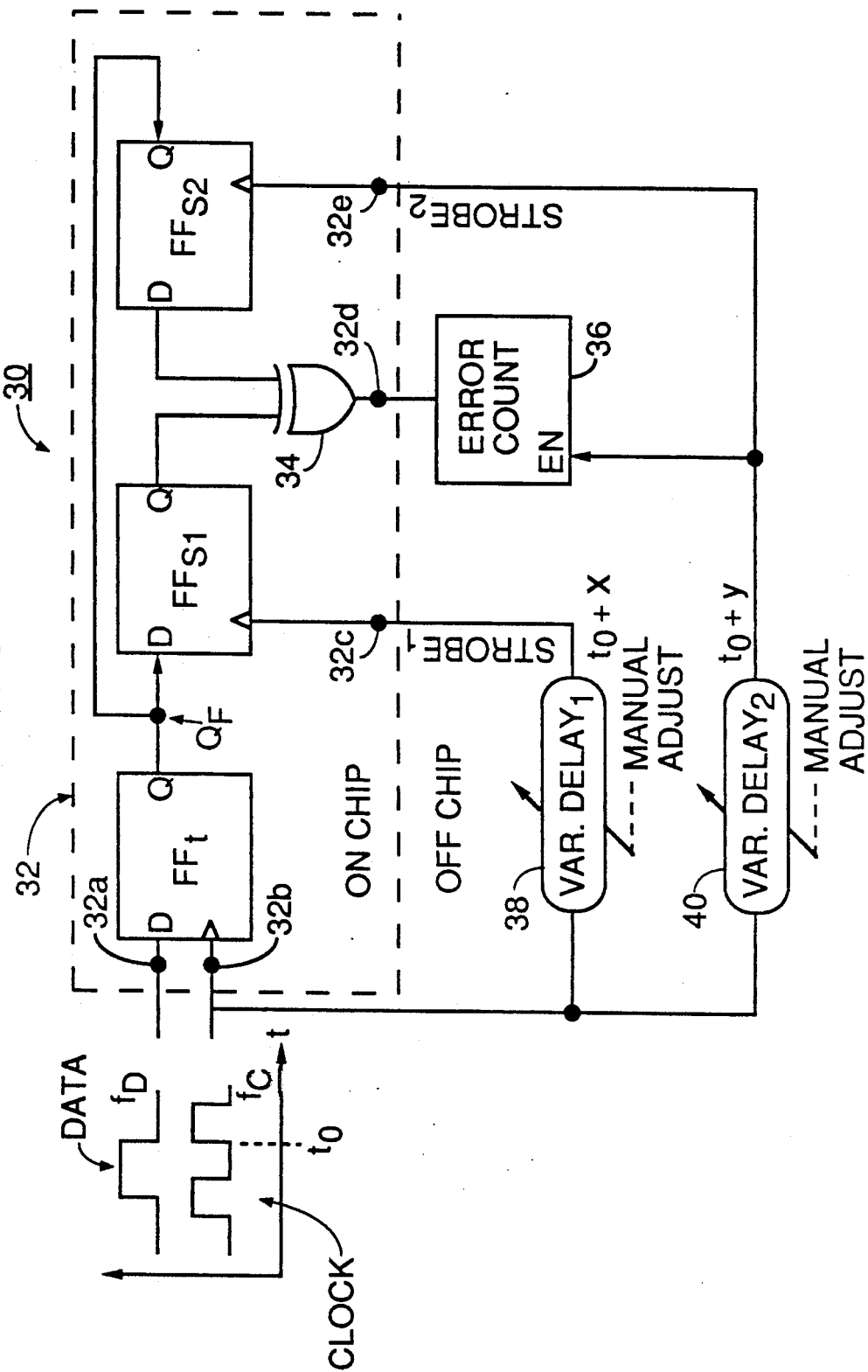
FIG. 3A is a schematic diagram of a previously proposed test circuit.
Figure 3B:
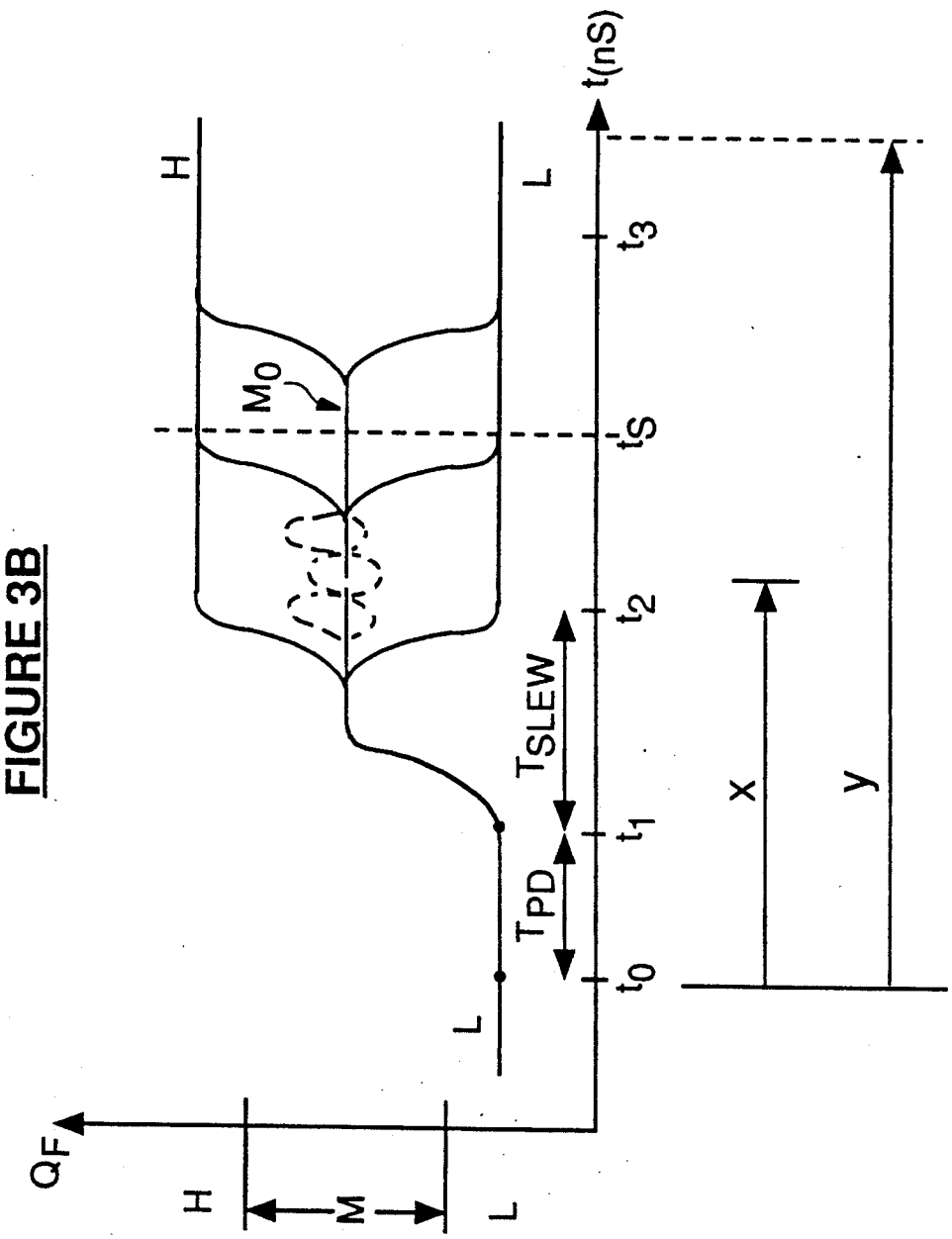
FIG. 3B is a graph of possible decision making paths which can be taken by the output signal of a bistable device.
Figure 5A:
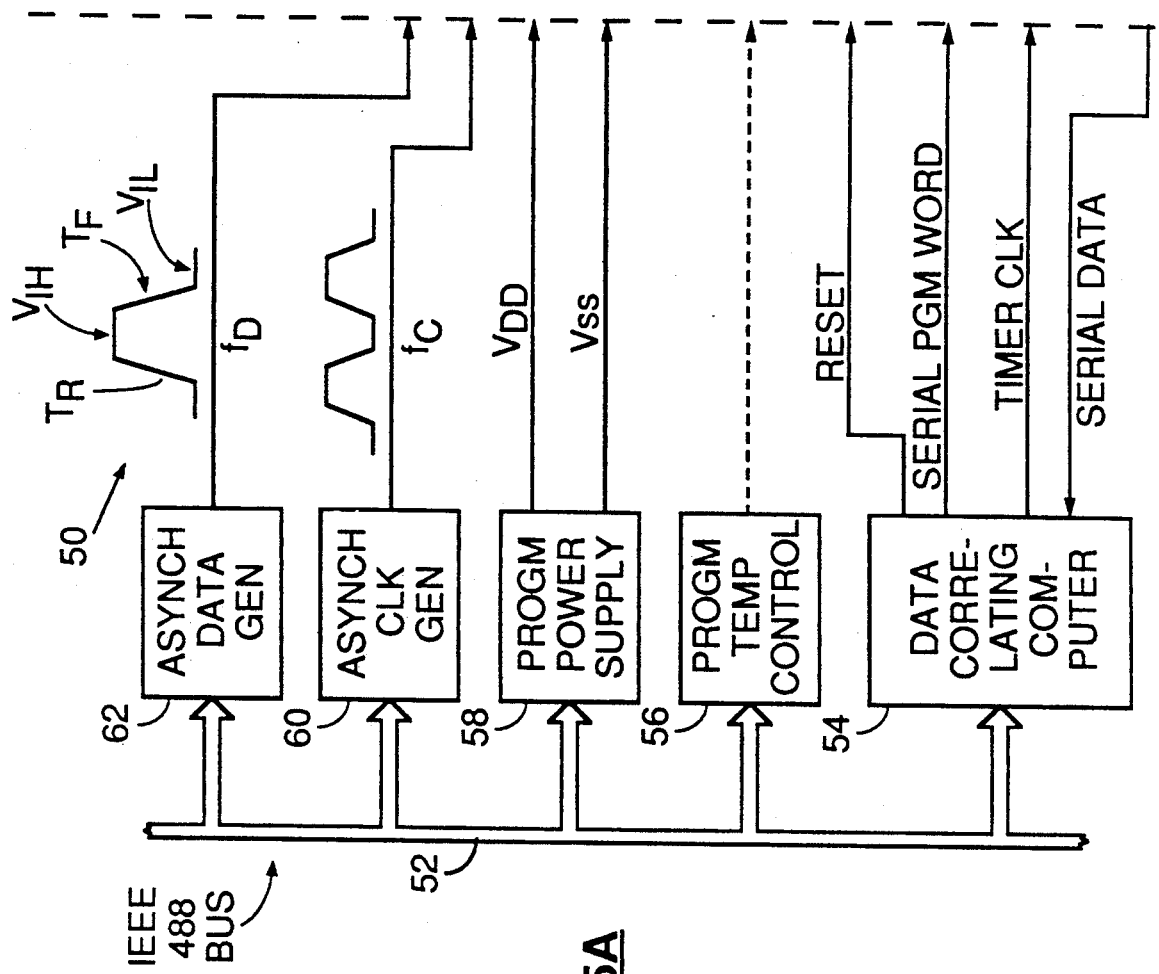
FIG. 5 is a schematic diagram of a first test apparatus in accordance with the present invention.
Figure 5:
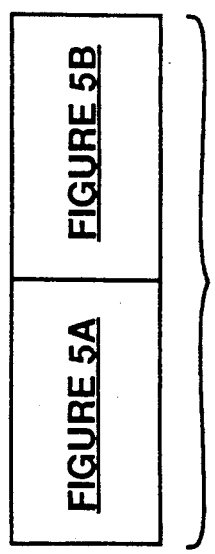

Referring to FIG. 5, a first measurement setup 50 in accordance with the invention comprises a measurement equipment communication bus 52 (preferably an IEEE 488 bus) interconnecting each of a measurement procedure control computer 54, a programmable temperature control 56, a programmable power supply 58, an asynchronous clock generator 60, an asynchronous data generator 62 and a precision phase detector 64. The precision phase detector 64 is preferably a Textronix Model No. 7854 oscilloscope or a similar threshold triggered type of device. The asynchronous data generator 62 may be of a type such as a Hewlett-Packard Model HP 9007B waveform generator and is preferably of a type which can be programmed to select a desired pulse rise time $T_R$, a desired high voltage level $V_{IH}$, a desired pulse fall time $T_F$ and a desired logic low level $V_{IL}$. The clock generator 60 is preferably an IEEE bus compatible type oscillator such as the HP8082A manufactured by the Hewlett-Packard Corporation of Palo Alto, California. The programmable power supply 58 may be of a type such as Hewlett-Packard Models HP6286A and HP59501B which can be programmed to provide a plurality of constant level supply voltages (e.g. $V_{DD}$ and $V_{SS}$) to an integrated circuit chip. The programmable temperature control 56 may be of a type such as the Temptronic Model No. TP0412A which can be used to accurately control the temperature of a semiconductor substrate to a resolution of 1.0° C. or better over a range of, for example, −55° C. to +125° C. The procedure control computer 54 may be of a type specially designed to process large amounts of numerical data in minimum time or a general purpose computer. In the presently used setup, the computer is formed by combining an HP8016A word generator for supplying serial program words and an HP9836 IEEE bus controller for coordinating the operations of bus interconnected units.

The test setup 50 further includes an integrated circuit chip 70 having provided thereon a plurality of connection pads 70a-70j, a plurality of metastable devices (arbitration circuits) that are to be tested, $FF_{T1}$, $FF_{T2}$, ... $FF_{Tn}$; a plurality of sample and hold means, $FF_{S1}$, $FF_{S2}$, ... $FF_{S2n}$, among which odd-even numbered pairs are associated with corresponding ones of the metastable devices $FF_{T1}$-$FF_{Tn}$ to be tested; a plurality of comparators $72_1$, $72_2$, ... $72_n$ for detecting intra-pair differences in output among the sample and hold means pairs associated with each of the metastable devices under test $FF_{T1}$-$FF_{Tn}$; a plurality of gating devices $74_1$, $74_2$, ... $74_n$ for transmitting outputs of the comparators $72_1$-$72_n$ at a programmably adjusted time; a plurality of error latches (or error counters) $76_1$-$76_n$ for retaining the gated outputs of the comparators, $72_1$-$72_n$; and a multiplexer 78 for transmitting a selected one or a plurality of outputs $E_1$-$E_n$ from the error latches $76_1$-$76_n$ in response to a multiplexer select signal 78a generated by a programmable control circuit 79. The multiplexer 78 preferably has additional inputs $Q_{T1}'$-$Q_{Tn}'$ coupled to respective inverted outputs $Q_{T1}$-$Q_{Tn}$ of the devices under test $FF_{T1}$-$FF_{Tn}$ for transmitting the output state of the devices under test (1 or 0) at a programmed point in time (established by timer output strobe signal $O_5$) that is typically much later in time than the sampling points of sample and hold means $FF_{S1}$-$FF_{S2n}$.

An on-chip programmable delay circuit 80, preferably having first through fifth tapped outputs for outputting strobe signals $O_1$-$O_5$, is integrally formed on the chip 70 in such a manner that first and second strobe lines, 81 and 82, of the delay circuit 80 are structured to provide substantially identical conduction paths for strobe signals $O_1$ and $O_2$ emanating from respective first and second outputs of the delay circuit 80. First and second strobe lines 81 and 82 route strobe signals $O_1$ and $O_2$ to output pads 70j and 70i of the chip 70. The matched structure of the first strobe line 81 and second strobe line 82 allows signals of substantially identical waveforms, although delayed in phase, to be established at chip connection pads 70j and 70i. The phase detector 64 is used to measure the time delay between substantially identical levels in the respective waveforms of strobe signals $O_1$ and $O_2$ appearing on lines 81 and 82. The first strobe line 81 supplies signal $O_1$ to gate inputs of the devices under test $FF_{T1}$-$FF_{Tn}$ while second strobe line 82 supplies signal $O_2$ to gate inputs (clock inputs) of the odd numbered sample and hold devices, $FF_{S1}$, $FF_{S3}$, ... $FF_{Sn2-1}$. Matched output buffers, 91 and 92, are preferably used to keep the loads on strobe lines 81 and 82 as nearly identical as possible and to assure that the signals on pads 70i and 70j will remain substantially identical in waveform.

The programmable delay circuit 80 also has third, fourth and fifth strobe outputs for outputting delayed signals $O_3$, $O_4$ and $O_5$ which are respectively used for driving respective third, fourth and fifth strobe lines 83, 84 and 85. The third strobe line 83 is connected to gate inputs of the even numbered sample and hold devices $FF_{S2}$-$FF_{S2n}$. The fourth strobe line 84 is connected to activate signal gating devices $74_1$-$74_n$. The fifth strobe line 85 is connected to control circuit 79 so that the control circuit 79 can detect the end of a test cycle. The phase relations between corresponding pulses on the first strobe line 81 and strobe lines 82, 83 and 84 are respectively denoted by x, y and z.

A high speed counter 88 may be optionally included on the substrate 70 for obtaining a crude measure of the time delay x by counting the number of cycles of a high frequency clock signal (pad 70g) between arrival times of two signals from two of the tapped delays (e.g. $O_1$ and $O_2$) of the delay circuit 80. The cycle count is output to the procedure control computer 54 through a serial output pad 70h so that the computer 54 can cross check this cycle count with a precision phase measurement m output by the phase detector 64. Initially it was thought that x could be indirectly calculated by simply dividing the output value of counter 88 with a ratio of the number of delay stages used for the x delay and the number of stages used for a larger more easily measured delay, such as z, for example. However, it was found that significant variation from one stage of delay circuit 80 to the next occurs in the nanosecond resolution range and below even though the stages appear to be identically formed on the same substrate 70. These time delay differences are believed to be due to: (1) nonhomogeneities in component characteristics [i.e. difference in current sinking and current sourcing capabilities of N and P channel field effect transistors in a CMOS design]; (2) variations in circuit layout [i.e. different conductor lengths and shapes producing inconsistent resistive, capacitive and inductive effects]; and (3) localized non-homogeneities of the substrate material i.e. crystal defects]. The use of a phase detector 64 to measure the delay x directly was found to be preferable.

Figure 6:
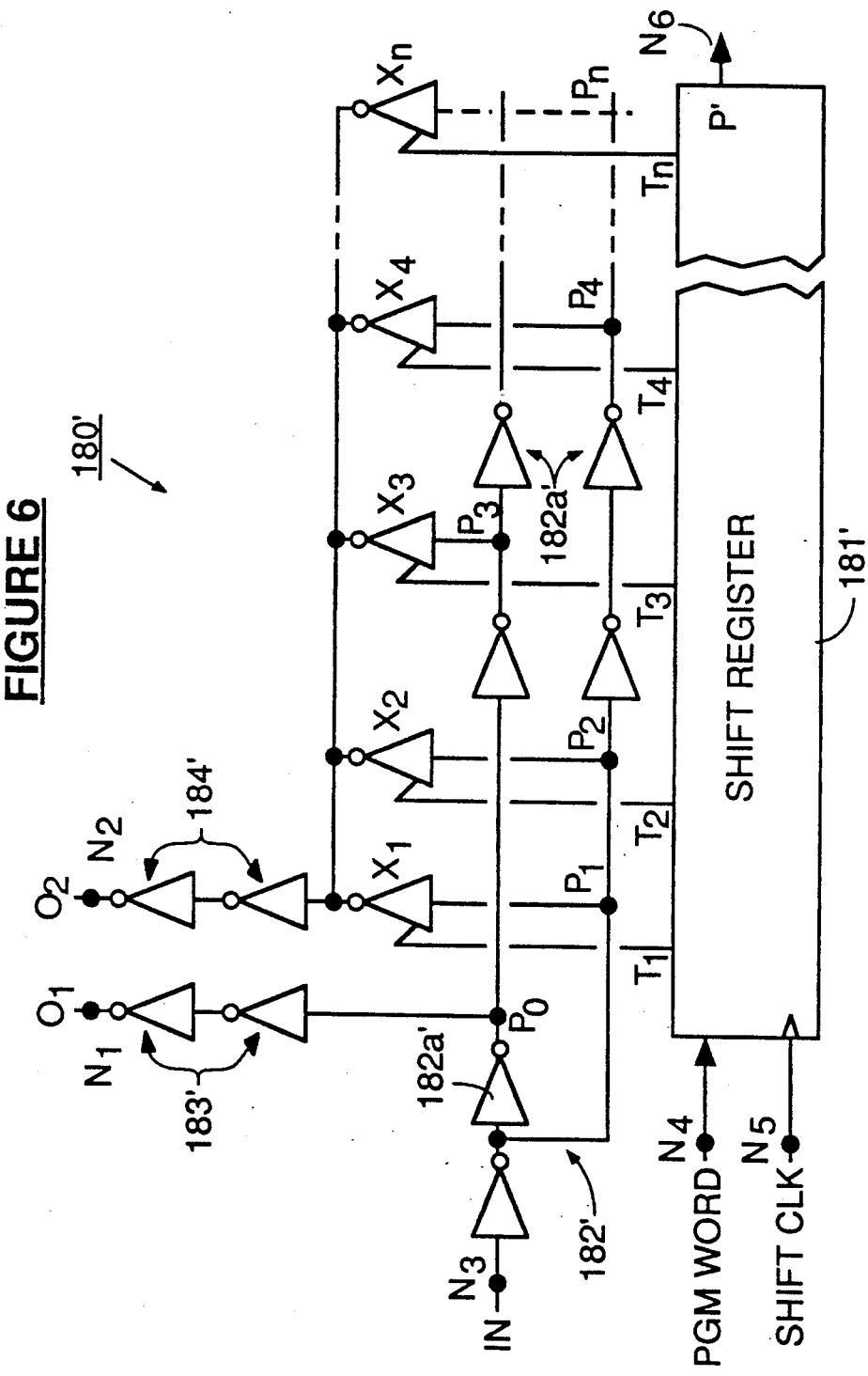
FIG. 6 is a schematic diagram of a first programmable time delay circuit unit.

FIG. 6 shows a first type of programmable delay unit 180' which may be used to implement the programmable delay circuit 80 of FIG. 5. Programmable delay unit 180' comprises first and second output nodes, $N_1$ and $N_2$, a signal input node $N_3$, a serial program word input node $N_4$, a shift clock node $N_5$ and a serial program word output node $N_6$. A programming word composed of a series of on and off bits is loaded through the program word input node $N_4$ into a shift register 181' to set respective parallel output lines $T_1$, $T_2$, $T_3$, ..., $T_n$, of the shift register 181' either on or off. Parallel output lines $T_1$-$T_n$ actuate respective signal transmission gates $X_1$, $X_2$, ..., $X_n$, so as to switchably connect, in a digital manner, various points, $P_1$, $P_2$, ... $P_n$, of a tapped delay line 182' to the second output node $N_2$. The tapped delay line 182' may be formed as shown of a plurality of inverters 182a' connected in series by interconnect lines of various lengths. The first output node $N_1$ is coupled to a first point $P_0$ of the tapped delay line 182' by means of one or more buffers 183'. One or more matched buffers 184', substantially identical to the buffers 183' of node $N_1$, are used to link the second node $N_2$ to the outputs of the programmably selectable transmission gates $X_1$-$X_n$.

The precise delay between output signals $O_1$ and $O_2$ produced respectively at the first and second output nodes, $N_1$ and $N_2$ of unit 180', and here we are speaking in terms of a few nanoseconds or less, may vary in unique ways even though the stages of the tapped delay line 182' appear to be formed in identical manners on a common integrated circuit substrate. Minute variations such as in the length of an interconnect line between a first pick off point $P_1$ and a second pick off point $P_2$ or between individual inverters 182a' can contribute to these unique differences. These minute differences in delay time can, however, be repeatedly reproduced from the same delay unit 180' once the circuit of delay unit 180' is fixedly formed on a semiconductive substrate and variable factors such as temperature and power supply settings are frozen to specific values. As such, plural versions of the time delay unit 180' can be connected in a time additive manner together with or without non-programmable fixed time delay units interposed as desired to form a programmable delay circuit 80 having a phase delay between various outputs ($O_1$–$O_5$) which is repeatedly reproducible to resolutions of a fraction of a nanosecond or less.

A serial programming word may be laced from the shift register 181' of a first programmable time delay unit 180' to the shift register of another such programmable time delay unit by serially shifting the signal out through a programming output port P' of the shift register shown connected to the sixth node $N_6$. This allows plural shift registers to be programmed with a single serial input line.

Figure 7:
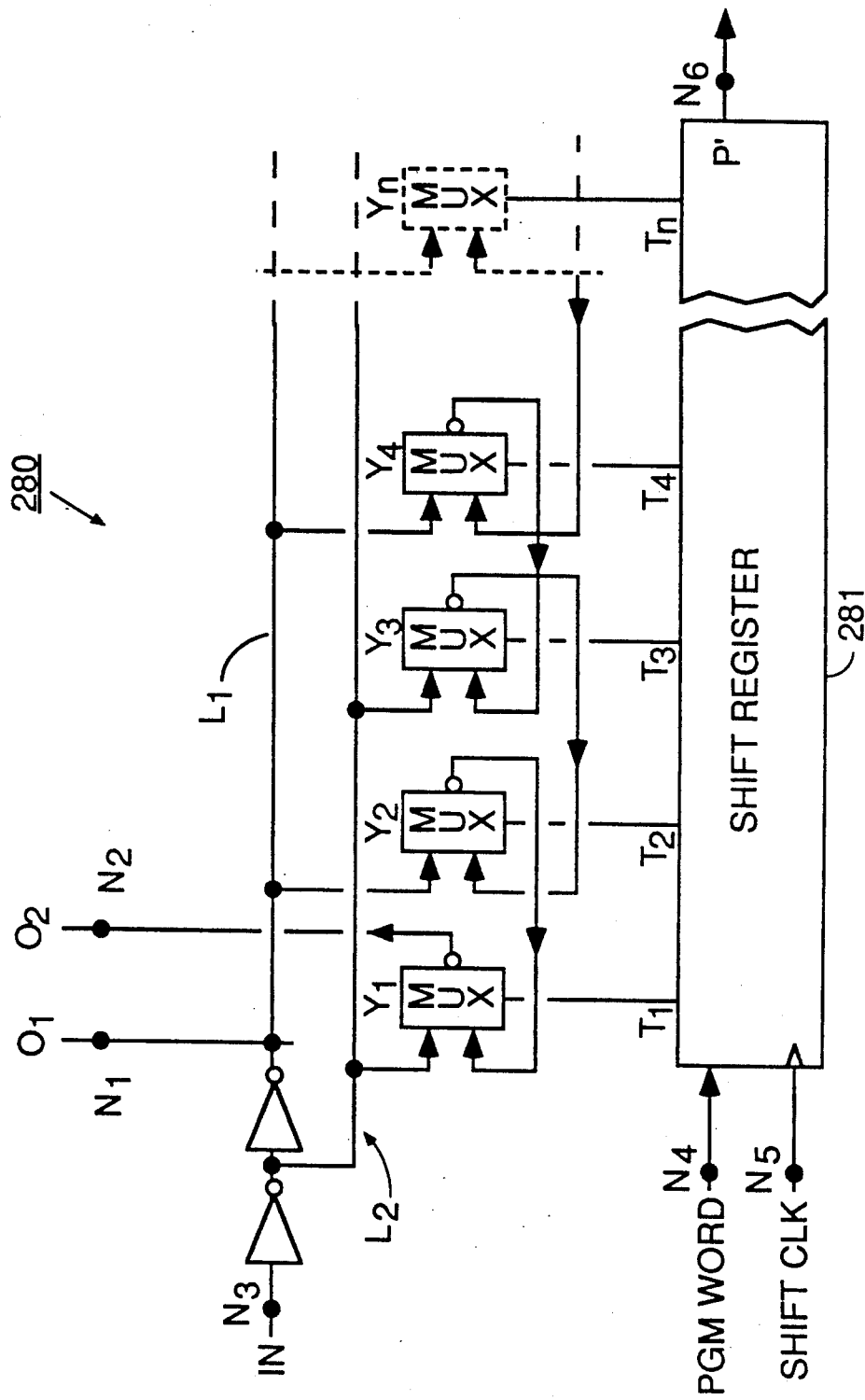
FIG. 7 is a schematic diagram of a second programmable time delay circuit unit.
Figure 13:
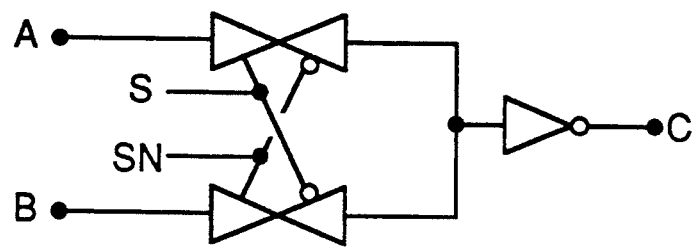
FIG. 13 shows a CMOS type multiplexer.

FIG. 7 shows another programmable time delay unit 280 which may be used to implement parts or all of the programmable delay circuit 80 of FIG. 5. The programmable delay unit 280 comprises a serial shift register 281 for receiving a serial programming word and outputting bits of the programming word on respective parallel outputs $T_1$–$T_n$. A plurality of multiplexers $Y_1$, $Y_2$, $Y_3$, . . ., $Y_n$ having inverting outputs are strung together in a serial fashion as shown in FIG. 7 to form an additive type of delay line. A relatively small delay time is obtained if the input signal of input node $N_3$ is allowed to travel from input line $L_2$ through just multiplexer $Y_1$ to output node $N_2$. If output line $T_1$ of shift register 281 is suitably activated, however, the input signal of node $N_3$ will be forced to travel from input line $L_1$ through multiplexer $Y_2$ and from there through multiplexer $Y_1$ before arriving at output node $N_2$. A larger time delay can be obtained by such programmable activation of line $T_1$. Even larger time delays can be realized by suitably activating output lines $T_2$–$T_n$ of shift register 281 so that the input signal is further forced to lace through multiplexers $Y_3$–$Y_n$ before arriving at the output node $N_2$. The multiplexers $Y_1$–$Y_n$ can be formed according to well known methods. FIG. 13 shows an example of such a multiplexer implemented with plural CMOS transmission gates and a CMOS inverter.

Referring back to FIG. 5, a measurement procedure using the illustrated test set up 50 will now be described. The chip 70 is fabricated using a particular fabrication process to be studied (e.g. CMOS, TTL, NMOS, two micron width lines, one micron width lines, $SiO_2$ insulation, $Si_3N_4$ insulation, etc.). Test devices $FF_{T1}$–$FF_{Tn}$ are each fabricated to have slightly different geometries or even radically different topologies. When different topologies are to be tested, $FF_{T1}$ may be a R-S flip flop while test device $FF_{T2}$ may be a J-K type flip flop and test device $FF_{T3}$ may be a D type of flip flop with a gated input.

Figure 14:
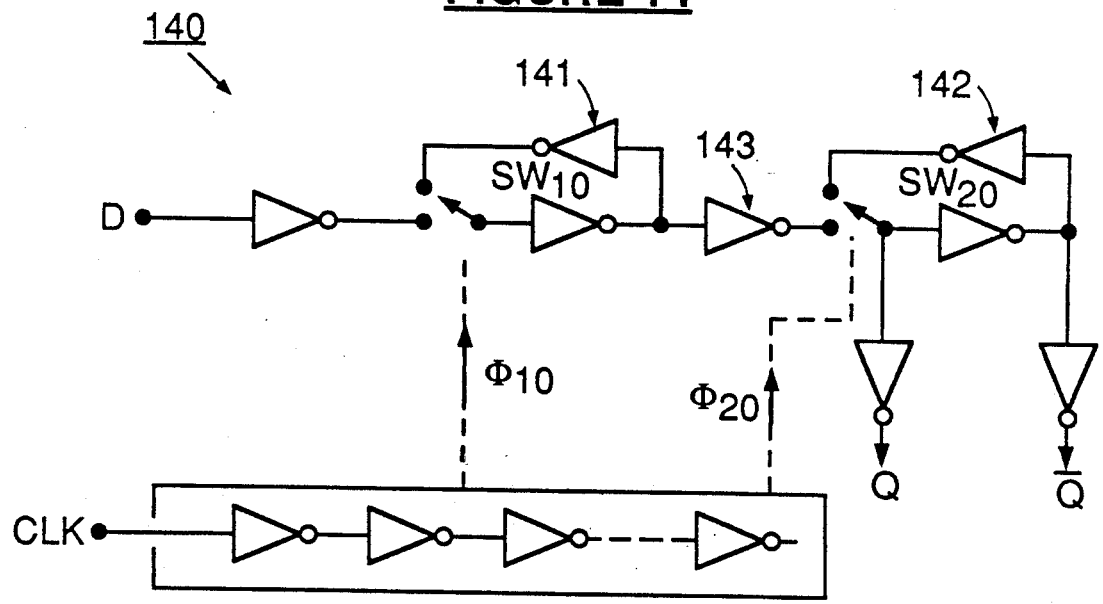
FIG. 14 shows the topology of a multilatch type of flip flop whose metastable hardness characteristics may be worthy of consideration.

FIG. 14 shows the topology of one D type of dual latch flip flop 140 whose metastable behavior is under study. Latching switches $SW_{10}$ and $SW_{20}$ respond to time delayed actuating signals $\phi_{10}$ and $\phi_{20}$ respectively to open and close master/slave latches 141 and 142. Variations in the size, delay and interconnection of the latches and in the gain and/or loading of the inverters can change the ability of the flip flop 140 to resist erroneous outcomes resulting from metastable behavior. Different variations in designs can be tested on a common substrate to find those designs which maximize a so-called "metastability hardness" characteristic of flip flops (ability to avoid prolonged meandering in the M state).

Returning to FIG. 5, the procedure control computer 54 is programmed to switch the programmable power supply 58 across at least three different power settings representing a minimum expected value, a nominal value and a maximum expected value (e.g. 4.5 volts, 5.0 volts and 5.5 volts for CMOS and TTL type circuits). The procedure control computer 54 is further programmed to switch the programmable temperature control 56 across at least three temperature settings representing a minimum expected operating temperature, a nominal operating temperature, and a maximum expected operating temperature (e.g. −55° C., +25° C. and +125° C.). Additionally, the procedure control computer 54 is programmed to instruct the data generator 62 to establish a DATA signal having a predetermined data frequency $f_D$, rise time $T_R$, high level voltage $V_{IH}$, fall time $T_F$, and low level voltage $V_{IL}$ in accordance with minimum, nominal and maximum values of a particular system specification. These conditions are stepped through one at a time and the computer 54 is programmed to collect and order the voluminous amount of data resulting for measurements under each condition.

Figure 8:
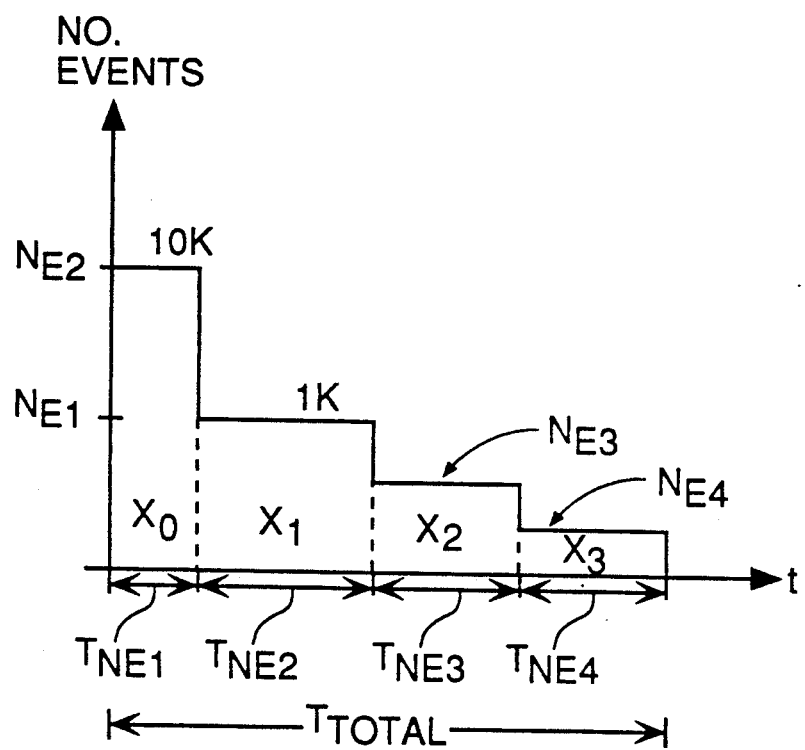
FIG. 8 is an events count versus measurement time histogram for explaining a test procedure in accordance with the invention.

A serial programming word is sent to control unit 79 via serial interconnect line 86 so that the control unit 79 generates a desired event line selecting signal 78a for selecting a particular one or more of event lines $E_1$–$E_n$, each respectively associated with one of the test devices $FF_{T1}$–$FF_{Tn}$. The states of test devices $FF_{T1}$–$FF_{Tn}$, sampling devices $FF_{S1}$–$FF_{S2n}$ and error latches $76_1$–$76_n$ are first initialized by way of a global reset signal supplied by the control computer 54 to the chip 70 through connection pad 70e. The computer 54 then begins to count the number of events (errors) reported by error latches $76_1$–$76_n$ while the first sampling time x is maintained at an initial minimum value, $x_{00}$, until a first predetermined number of events $N_{E1}$ (e.g. ten or one hundred thousand counts) is accumulated for each of the test devices. Referring to FIG. 8, the time $T_{NE1}$ for accumulating this first number of events $N_{E1}$ is recorded in a memory (not shown) of the procedure control computer 54 and a corresponding mean time between failure (MTBF) is calculated $MTBF_1 = T_{NE1}/N_{E1}$. Computer 54 requests a measurement value m from the precision phase detector 64 and associates this measurement value m with the first MTBF recorded in its memory.

The value x of the first time delay is incremented to a larger value, say $x = x_{01}$. The error accumulating procedure is repeated with the same number of events limit $N_{E1}$ as before. The time required $T_{NE}$ for accumulating the set event limit $N_E$ is recorded in memory and associated with delay measurement $m_{01} = x_{01} + e_{01}$ provided by the phase detector 64, where $x_{01}$ represents the actual delay value and $e_{01}$ represents a measurement error inherently included in the measurement value provided by the phase detector 64. The implication of this measurement error will be explained later.

As the value of the time delay x is increased, there will be a point in the procedure when the time $T_{NE}$ required for collecting a first predetermined number of events $N_{E1}$ will be an order of magnitude larger than the time required when x was a minimum $x_{00}$, say half an hour instead of three minutes. This can be seen by reference to FIG. 9 wherein there is shown a curve 100 depicting how measurement time $T_{NE}$ increases exponentially for a constant number of events $N_E$ while the value of x is increased linearly. If this were allowed to continue, it would take an extremely long time (hours or days) to complete measurements across the entire scale of possible x values. The computer 54 is accordingly programmed to switch its accumulated error count limit to a lower value $N_{E2}$ (e.g. one thousand events) so that the corresponding error accumulating time $T_{NE2}$ for delay values in a range $x > x_{10} > x_{00}$ is accordingly reduced.

At yell a further point in the incrementing of the time value x, the computer 54 is programmed to switch from an event number limited strategy to a time limited strategy. A maximum allowable time $T_{total}$ for each device under test $FF_t$ is preprogrammed into the computer 54. When the computer detects that its accumulated measurement time is nearing the end of the allowed total time $T_{total}$, the computer divides the remaining time into roughly equal, although progressively bigger, intervals, $T_{NE3}$, $T_{NE4}$, and so forth. The number of events accumulated in each of these last intervals is used for calculating MTBF according to the formula MTBF $= T_{NE}/N_E$ without regard to the fact that the number of events is less than a more statistically desired large number.

Figure 9:
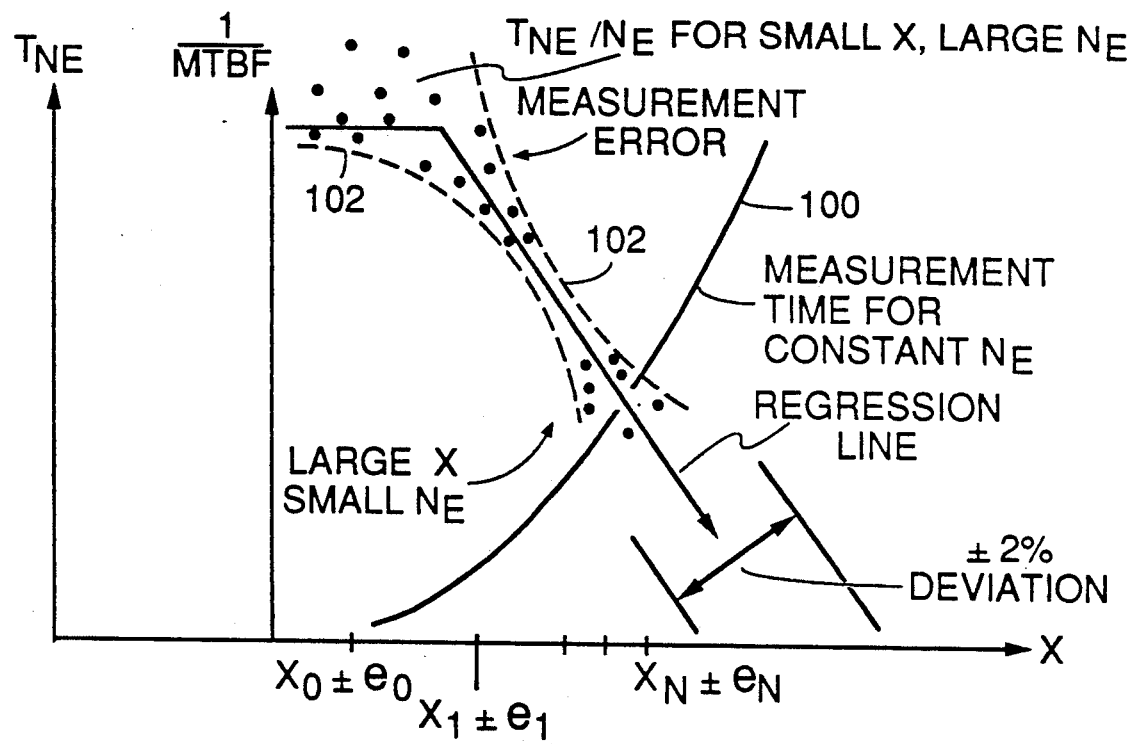
FIG. 9 diagrams how relative plotting error can converge with respect to actual time delay values and how the testing time required for obtaining a predetermined number of events can change with respect to the time delay value.

A suitable regression algorithm is applied to the collected sample points as plotted on a log (MTBF) scale versus a time delay x scale. The regression algorithm should take into consideration a number of factors. Referring to FIG. 9, it should be noted that the vertical and horizontal locations of each plot point are based respectively on a stochastic function $T_{NE}/N_E$ where $N_E$ might not always be large enough to assure statistically relevant results and on a measured value of time $m = x \pm e$ which includes a resolution error e rather than an actual value of time delay x. The resolution error e of measurement m arises from a resolution limit that is inherent in the precision phase detector 64. In the case where the phase detector 64 is a Textronix Model No. 7854 oscilloscope, the resolution is believed to be limited to approximately ten picoseconds. As the time delay value x increases by orders of picoseconds, the relative error $(x \pm e)/x$ of each measurement decreases as indicated by the converging upper curves 102 of FIG. 9. MTBF measurements at higher values of time delay x should accordingly be given greater weight in the regression analysis than those at lower values of the time delay scale x. On the other hand, as the total number of accumulated events $N_E$ for each value of x decreases as shown in FIG. 8, the statistical reliability of measurements made with accumulated counts ($N_{E4}$) should be given less weight than those taken with a large number of events ($N_{E2}$).

As such, there will be an initial set of points with relatively large variations (by large we mean here deviations from linearity greater than $\pm 2\%$) due to time resolution error e which should be weighted out of the linear regression algorithm and there may also be a final set of points with wide variations away from the regression line, as a result of small $N_E$ values, which should also be weighted out of the linear regression algorithm. The specifics for such weighting will, of course, vary from one situation to the next depending on the level of statistical reliability desired and the metastable characteristics of the devices under test.

Figure 10:
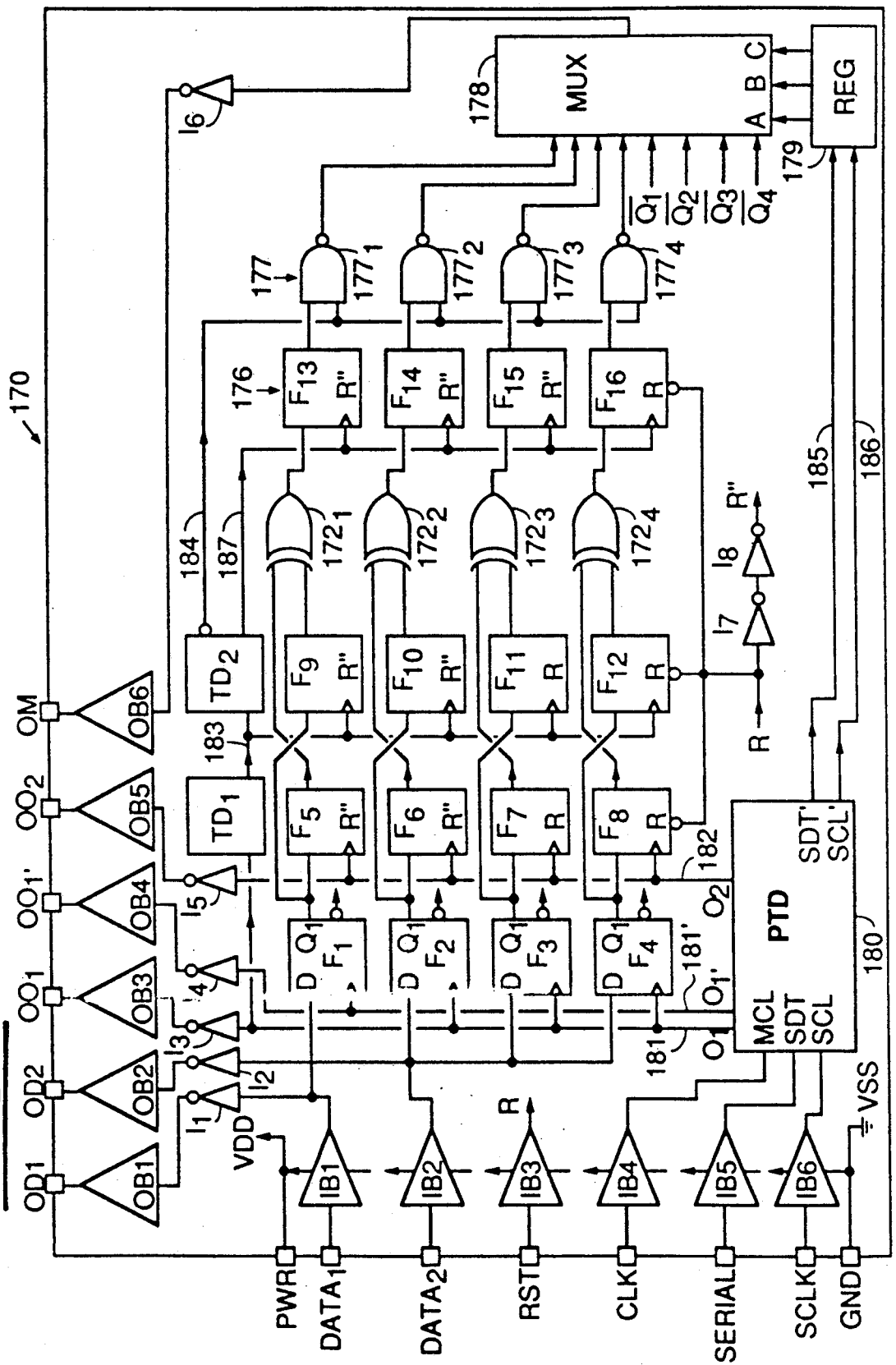
FIG. 10 is a schematic of a second test apparatus.

FIG. 10 illustrates a second integrated circuit chip 170 which may be utilized in a test setup such as the one 50 used in conjunction with chip 70 of FIG. 5. Unlike the first chip 70, the second chip 170 has two data signal inputs, $DATA_1$ and $DATA_2$, for isolatively supplying input signals of different edge rates to test flip flops $F_1$ and $F_2$. Chip 170 further has separate strobe lines 181 and 181' for supplying strobe signals $O_1$ and $O_1'$ of different edge rates to the clock inputs of test flip flops $F_1$ and $F_2$. Test flip flops $F_1$ and $F_2$ are preferably of the same design, e.g. both are D-type master/slave flip flops, so that comparisons can be made between the metastable behavior of substantially identical circuits when only the input signal characteristics are changed. Input buffer $IB_1$ is loaded only by inverter $I_1$ and the D input of test flip flop $F_1$ while input buffer $IB_2$ is loaded by inverter $I_2$ and the three D inputs of test flip flops $F_2$, $F_3$ and $F_4$. The limited loading of input buffer $IB_1$ allows data signals of higher edge rates to be developed at the D input of test flip flop $F_1$ as compared to the edge rates possible at the D inputs of test flip flops $F_2$-$F_4$. Likewise, strobe line 181' is loaded by the single clock input of $F_1$ while strobe line 181 is loaded by the multiple clock inputs of $F_2$-$F_4$ so that pulses with steeper edges can be developed on the less heavily loaded strobe line, 181'.

This embodiment allowed the inventors to discover that the effect of metastable behavior can be suppressed in many designs (e.g. FIG. 14) simply by increasing the slope of the leading edge of clock pulses (strobe signals $O_1$ and $O_1'$) presented to an arbitration device. Remarkably, this phenomenon is observed even when the input and/or outputs of the flip flop cells are internally buffered. It is believed that the probability of metastable behavior appears to be reduced by increasing the edge rate of the clock signals because increasing the edge rate diminishes the delay time (propagation delay) between the initial knee of a clock signal edge and the point when the clock signal crosses the threshold level (triggering point) of the arbitration device under test. As a result of the tests, it can be concluded that loading on the clock input lines of metastability critical flip flops should be minimized as much as possible (and/or the input threshold levels should be minimized as much as possible) so that the arbitration threshold level is reached as quickly as possible and the flip flops have more time to settle into a valid H or L state.

In order to make valid comparisons between the metastable behaviors of flip flops $F_1$ and $F_2$ when all other factors are equal, it is important to assure that the loadings on respective flip flop outputs $Q_1$ and $Q_2$ are as nearly identical as possible. In accordance with the invention, the conduction distance between output $Q_1$ and the inputs of first sampling flip flop $F_5$ and second sampling flip flop $F_9$ are made as identical as possible to corresponding conduction distances between output $Q_2$ and first sampling flip flop $F_6$ and second sampling flip flop $F_{10}$ associated with the second test flip flop $F_2$. As before, strobe lines 181 and 182 are preferably matched one to another so that strobe signals $O_1$ and $O_2$ of substantially identical waveforms will develop at respective chip output terminals $OO_1$ and $OO_2$.

A glitch mask 177 formed of NAND gates $177_1$ through $177_4$ is used to hide any transition glitches from being interpreted as false error conditions by the procedure control computer. Strobe line 184 is activated to block the transmission of signals through glitch mask $177_1$-$177_4$ before strobe line 187 is actuated to change the status of error status latches $F_{13}$ through $F_{16}$. Time delay circuits $TD_1$ and $TD_2$ are formed of serially connected NOR gates such as shown in FIG. 11. The 184 strobe line of the second time delay circuit TD$_2$ is picked off at a stage prior to that of output strobe line 187 in order to activate the glitch hiding mask 177 prior to the error register 176. The output signal of multiplexer 178, as selected by controlling shift register 179, is transmitted through inverter I$_6$ to output buffer OB$_6$ and from there to an external data collection device through chip terminal OM. In the preferred embodiment, output buffers OB$_1$–OB$_6$ and input buffers IB$_1$–IB$_6$ are scaled to be much larger (e.g. 2 X to 30 X) than inverters I$_1$–I$_8$ in order to produce high edge rate signals on loaded lines. Inverters I$_7$ and I$_8$ are used to reduce loading on reset line R by providing a second reset line R" for flip flops F$_5$, F$_6$, F$_9$ and F$_{10}$.

FIG. 12 shows the preferred structure of programmable time delay 180. Serial programming data SDT is shifted into registers RY$_1$–RY$_5$ in synchronism with shift clock SCL. The Q/$\overline{Q}$ outputs of registers RY$_1$–RY$_5$, respectively, select by means of double rail selection lines (S and $\overline{S}$) either the A or B input terminal of a corresponding set of multiplexers PY$_1$–PY$_5$ and thereby route input signal MCL through a desired number of delay stages (the multiplexers PY$_1$–PY$_5$). Inverter I$_{11}$ isolates strobe line 181' (test flip flop F$_1$) from the loads on strobe line 181 (flip flops F$_2$–F$_4$) so that the O$_1$' strobe signal can have a faster edge rate than the O$_1$ strobe signal. Multiplexers PY$_1$–PY$_5$ may be of the plural transmission gate design shown in FIG. 13 or any other suitable design. The programmable time delay 180 may be expanded as indicated by the broken lines of FIG. 12 to include any number of delay stages (programmable and/or non-programmable) as desired. Test flip flops F$_1$–F$_4$ of FIG. 10 may be selected from a group of different designs including JK types, D types, T types (with an AND gate front end for gating data pulses with clock pulses) and so forth. The master/slave type of dual latch topology shown in FIG. 14 has been found particularly worthy of further study because of an observed hardness to metastable misbehavior as compared to other flip flop topologies. The gain bandwidth product of inverter stage 143 in combination with the phases of switch actuating signals $\phi_{10}$ and $\phi_{20}$ appears to play a major role in determining metastable hardness.

Figure 15:
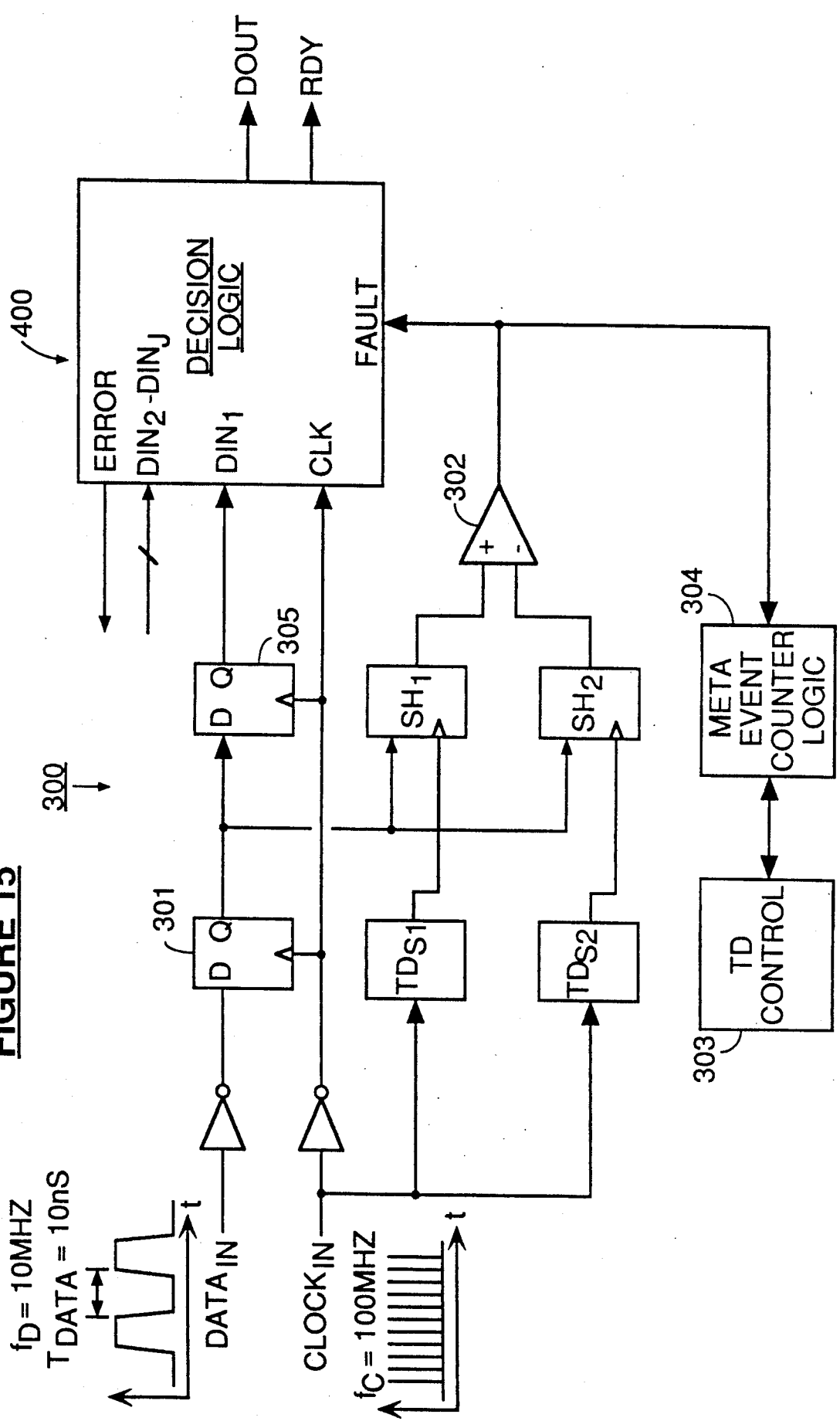
FIG. 15 shows a fault recovery circuit in accordance with the invention.

The principles of the present invention need not be limited just to the laboratory test environment. FIG. 15 illustrates a metastable behavior detecting circuit 300 which may be integrally formed on a semiconductive substrate with combinatorial decision logic 400 to detect the possibility of metastability induced error during the synchronization of an asynchronously produced input data signal DATA$_{in}$ to the phase of a supplied system clock CLOCK$_{in}$. If pulses of the input data signal DATA$_{in}$ arrive at a first synchronizing flip flop 301 at the rate of say once every 100 nanoseconds (10 MHz) and the synchronizing clock CLOCK$_{in}$ is operating at a much higher rate, say 100 MHz, then sample and hold devices SH$_1$ and SH$_2$ can be used to sample the output state of the first synchronizing flip flop 301 at first and second programmably determined sampling times before the potentially erroneous output signal of flip flop 301 is passed on to the decision logic 400 and from there to subsequent circuitry (not shown). Thus the validity of the logic state at the output side of first synchronizing flip flop 301 could be tested before the output D$_{out}$ of combinatorial logic 400, based on this logic state, is indicated by a ready signal RDY to be valid. The first and second sampling times could be say 9nS and 90nS, respectively, after the clocking of flip flop 301 but before the clocking of flip flop 305. The captured samples of SH$_1$ and SH$_2$ can be fed to comparator 302 to determine shortly after the second sampling time whether the state of flip flop 301 had stabilized by the first programmably determined sampling time (e.g. 9 nanoseconds) such that the logic level at the output line of flip flop 301 is the same at the first sampling time (e.g. 9 nanoseconds) as it is at a much later second sampling time (e.g. 90 nanoseconds). A logic true output by the comparator 302 preferably actuates a fault recovery sequence in the decision logic circuit 400 before the logic circuit 400 has a chance to issue a data valid or data ready signal RDY to subsequent circuitry (not shown) which responds to a decision output signal D$_{out}$ of the decision logic 400. The transmitter (not shown) of the data input signal DATA$_{in}$ could be asked to take corrective steps, i.e. either to slow its data transmission rate or repeat the last block of transmitted data, upon the setting of an ERROR flag by the decision logic 400 when a FAULT output line from the comparator 302 goes to a logic true state. It can be assumed that metastable oscillations are not occurring and no fault recovery will be needed when the output of synchronizing flip flop 301 is the same at both the first and second sampling times. Pulses of the input data signal DATA$_{in}$ can be safely accepted by the decision logic 400 at relatively high input rates when the FAULT line is at a logic false level without substantial risk that decision logic 400 will be responding to metastability induced transition levels or other erroneous results at the Q output terminal of flip flop 301. Time delay units TD$_{s1}$ and TD$_{s2}$ may be either fixedly preprogrammed in accordance with unique time delay patterns previously found to best predict metastable type of errors in laboratory tests or the time delay units TD$_{s1}$ and TD$_{s2}$ may be configured to be programmably responsive to an on-chip digital time delay control unit 303. In either case, units TD$_{s1}$ and TD$_{s2}$ should be integrally formed on the same chip with synchronizing flip flop 301 so that tight process and temperature correlations can be established with respect to the sub-microsecond behavior of the three on-chip units; TD$_{s1}$, TD$_{s2}$ and 301. In the case where time delay units TD$_{s1}$ and TD$_{s2}$ are configured to be of the variably programmable type, an event counter 304 is preferably used to count the number of faults N$_E$ generated during an initial test-run of the circuit using a pre-selected time window T$_{NE}$ so that the first and second sampling times can be fine tuned by suitable programming to obtain a statistically significant number of metastability induced errors during the test run. The first and second sampling times thus obtained are then held constant when an operational input data signal DATA$_{IN}$ rather than a test input signal is supplied during subsequent operation of the decision logic 400. The second synchronizing flip flop 305 is optionally interposed before the combinational logic circuits of the decision logic 400 in order to minimize loading on the output of the first synchronizing flip flop 301 and to mimic the metastable or non-metastable behavior of the first sampling flip flop SH$_1$. If we know that SH$_1$ was not exhibiting metastable behavior at 9 nanoseconds after the clock edge, we can assume that flip flop 305 (integrally formed with flip flop 301) is likewise not exhibiting metastable behavior 10 nanoseconds after the clock edge and thus assure that a faulty logic bit (metastably induced error) has not been transmitted to the decision logic 400, that assurance coming When the comparator 302 has had time to reach a fault/no-fault decision. One advantage of using this detecting circuit 300 is that it can reduce an undesirable time delay associated with previous synchronizing circuits in which many more synchronizing flip flops were serially ganged to couple an asynchronous input signal to decision logic. Another advantage is that the present circuit 300 is not susceptible to a ripple through effect wherein metastable type signals can ripple through serially ganged stages when the signals are produced at particular frequencies.

As can be seen, a detailed understanding of metastability behavior can help to produce circuits that are less susceptible to metastably induced decision errors and therefrom more reliable digital systems. The above described embodiments are, of course, illustrative examples of the present invention. The principles of the invention can be extended to many other applications once the principles are understood by those skilled in the art. As such, the scope of the invention should not be limited to the disclosed embodiments but should rather be viewed as encompassing the subject matter of at least the following claims.

We claim:

1. A circuit for detecting metastable behavior in multistable logic systems comprising:
   a substrate;
   one or more multistable devices integrally formed on the substrate, each of the one or more multistable devices including an actuating input terminal for receiving an actuation signal to actuate said each multistable device, a gating input terminal for receiving a strobe signal which gates the actuating effect of the actuation signal, and a digital decision output terminal for producing a decision signal in response to the received actuation and strobe signals;
   sampling means, coupled to the respective decision output terminal of each of the one or more multistable devices, for detecting a decision state at the respective decision output terminal of each of the one or more multistable devices at a first point and a second point in time; and
   digitally programmable time delay means, integrally formed on the substrate and operatively coupled to the respective gating input terminal of each of the one or more multistable devices and to the sampling means, for programmably establishing a delay time between a first strobe signal supplied to the gating input terminal of at least one of the one or more multistable devices and a second strobe signal supplied to the sampling means, the second strobe signal activating the sampling means to detect the decision state at the decision output terminal of the at least one of the one or more multistable devices.

2. The circuit of claim 1 wherein said substrate has at least two multistable devices integrally formed thereon, one of the at least two multistable devices having a design which is different from that of a second of the at least two multistable devices.

3. The circuit of claim 2 wherein the at least two multistable devices each includes a flip-flop, the respective flip-flops of the at least two multistable devices having designs which are different from each other.

4. The circuit of claim 3 wherein the flip-flops have respective different designs selected from the group consisting of: a JK flip-flop, a D flip-flop, and a RS flip-flop.

5. The circuit of claim 1 wherein said substrate has at least two multistable devices with a same design integrally formed thereon but wherein respective actuating input terminals, gating input terminals and decision output terminals of the at least two multistable deices are connected to signal lines of different respective loading factors.

6. The circuit of claim 1 wherein the programmable time delay means includes a serial shift register having parallel output lines and a plurality of multiplexers having input selecting terminals responsively coupled to the parallel output lines of the shift register.

7. The circuit of claim 1 wherein the sampling means includes first and second sampling flip-flops each of which is respectively coupled to a decision output terminal of one of the multistable devices through respective first and second coupling lines, said coupling lines being of substantially identical lengths, and the sampling means further includes comparator means, coupled to respective output terminals of the first and second sampling flip-flops, for comparing states of the first and second sampling flip-flops and for producing an error signal indicating a difference between said states.

8. The circuit of claim 1 further comprising:
   phase detector means, coupled to receive the first and second strobe signals, for generating time delay data indicative of the delay time between the first and second strobe signals;
   event counter means, coupled to the sampling means, for counting a number of times that one of the one or more multistable devices has different decision states at the first and second points in time and for producing event count data indicative thereof; and
   data collecting means, coupled to the phase detector means and the event counter means, for collecting respective time delay data and event count data from the event counter means and for linking pairs of the time delay data and event count data to produce mean time between failure values.

9. The circuit of claim 8 further comprising:
   a test procedure control computer coupled to the data collecting means;
   programmable temperature setting means, thermally coupled to the substrate and being responsive to test procedure instructions supplied by the control computer, for programmably setting a temperature of the substrate equal to a predetermined temperature level; and
   programmable power supply means, electrically coupled to supply constant voltages to the substrate and being responsive to instructions supplied by the computer, for programmable setting its constant voltages equal to predetermined levels.

10. The circuit of claim 1 wherein said substrate has at least two multistable devices with a same design integrally formed thereon but wherein respective actuating input terminals of the at least two multistable devices are connected to signal lines of different respective loading factors.

11. The circuit of claim 1 wherein said substrate has at least two multistable devices with a same design integrally formed thereon but wherein respective gating input terminals of the at least two multistable devices are connected to signal lines of different respective loading factors.

12. The circuit of claim 1 wherein said substrate has at least two multistable devices with a same design integrally formed thereon but wherein respective decision output terminals of the at least two multistable devices are connected to signal lines of different respective loading factors.

13. In a method for determining a mean time between failure (MTBF) of multistable digital logic devices, the method comprising the steps of:

integrally fabricating a digitally programmable time delay unit having a signal output terminal on a semiconductor substrate;

integrally fabricating one or more multistable logic units whose MTBF is to be determined on said substrate, the one or more multistable logic units each having a signal input terminal; and coupling the signal output terminal of said time delay unit to the signal input terminal of each of said one or more multistable logic units.

14. The method of claim 13 further comprising:

digitally setting the temperature of the substrate to be equal to, at different times, a predetermined nominal temperature level, a predetermined maximum temperature level and a predetermined minimum temperature level;

digitally developing, at different times, respective different levels of constant power supply voltages on the substrate, the different voltage levels including predetermined nominal, maximum and minimum voltage levels; and digitally changing a time delay of said digitally programmable time delay unit.

15. The method of claim 14 further comprising:

coupling event counter means to said substrate for counting a number of times during an event count duration that the one or more multistable logic units produce different decisions for a same input signal at a first time point and a second time point following reception of the same input signal;

operating the event counter means during a first mode until said number of times reaches a predetermined maximum event count number and measuring a length of the event count duration; and operating the event counter means during a second mode until the event count duration reaches a predetermined maximum length and collecting said number of times of the event counter means.

* * * * *